United States Patent
Steensgaard-Madsen et al.

(10) Patent No.: US 11,545,991 B2
(45) Date of Patent: Jan. 3, 2023

(54) ANALOG-TO-DIGITAL CONVERTER WITH AUTO-ZEROING RESIDUE AMPLIFICATION CIRCUIT

(71) Applicant: Analog Devices, Inc., Wilmington, MA (US)

(72) Inventors: Jesper Steensgaard-Madsen, Sequim, WA (US); Andrew J. Thomas, Arlington, MA (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 17/524,542

(22) Filed: Nov. 11, 2021

(65) Prior Publication Data

US 2022/0077868 A1 Mar. 10, 2022

Related U.S. Application Data

(63) Continuation of application No. 16/990,410, filed on Aug. 11, 2020, now Pat. No. 11,177,821.

(51) Int. Cl.
*H03M 1/10* (2006.01)
*H03M 1/42* (2006.01)
*H03M 1/44* (2006.01)

(52) U.S. Cl.
CPC ........... *H03M 1/1023* (2013.01); *H03M 1/42* (2013.01); *H03M 1/44* (2013.01)

(58) Field of Classification Search
CPC ........ H03M 1/1023; H03M 1/42; H03M 1/44; H03M 1/442; H03M 1/466; H03M 1/0607; H03M 1/08; H03M 1/38; H03M 1/124; H03M 1/46; H03F 3/38; H03F 3/45475; H03F 3/005
USPC ................................ 341/118, 120, 131, 161
See application file for complete search history.

(56) References Cited

U.S. PATENT DOCUMENTS

| | | | |
|---|---|---|---|
| 7,358,876 B1 | 4/2008 | Oo et al. | |
| 8,040,264 B2 * | 10/2011 | Hummerston | H03M 1/12 341/118 |
| 8,736,471 B2 * | 5/2014 | Hernes | H03M 1/1061 341/161 |
| 9,588,497 B1 | 3/2017 | Monk et al. | |

(Continued)

FOREIGN PATENT DOCUMENTS

| | | |
|---|---|---|
| CN | 101394163 | 3/2009 |
| CN | 103490752 A | 1/2014 |

OTHER PUBLICATIONS

EP Search Report dated Jan. 3, 2022, in EP Application 21190082.4, 14 pages.

(Continued)

*Primary Examiner* — Khai M Nguyen

(74) *Attorney, Agent, or Firm* — Akona IP PC

(57) ABSTRACT

Disclosed herein are some examples of analog-to-digital converters (ADCs) that can perform auto-zeroing with amplifying a signal for improvement of a signal-to-noise ratio. The ADCs may produce a first digital code to represent an analog input signal and a second digital code based on a residue from the first digital code, and may combine the first digital code and the second digital code to produce a digital output code to represent the analog input signal. The ADC may utilize a first observation and a second observation of an analog residue value representing the residue to produce the second digital code.

20 Claims, 8 Drawing Sheets

(56) References Cited

U.S. PATENT DOCUMENTS

| | | |
|---|---|---|
| 10,122,370 B2 | 11/2018 | Bhatta et al. |
| 11,108,404 B1 | 8/2021 | Li |
| 2006/0145899 A1 | 7/2006 | Markowski et al. |
| 2011/0012767 A1 | 1/2011 | Deval et al. |
| 2012/0326901 A1 | 12/2012 | Zhao et al. |
| 2014/0375374 A1 | 12/2014 | Nervegna et al. |

OTHER PUBLICATIONS

Keane et al., *Background Interstage Gain Calibration Technigue for Pipelined ADCs*, IEEE Transactions on Circuits and Systems—1: Regular Papers, vol. 52, No. 1, Jan. 2005, 12 pages.
Annex Machine Translation of CN101394165, 9 pages.
EN Translation of CN103490752 A, 1 page.

\* cited by examiner

ANALOG-TO-DIGITAL CONVERTER WITH AUTO-ZEROING RESIDUE AMPLIFICATION CIRCUIT

PRIORITY DATA

This application is a continuation of U.S. Non-Provisional patent application Ser. No. 16/990,410 filed Aug. 11, 2020 entitled, "ANALOG-TO-DIGITAL CONVERTER WITH AUTO-ZEROING RESIDUE AMPLIFICATION CIRCUIT", which is hereby incorporated by reference in its entirety.

FIELD OF THE DISCLOSURE disclosure relates in general to the field of electronic circuits, and more particularly, though not exclusively, to a system and method for data conversion.

BACKGROUND

Analog signals and/or values can be produced in various kinds of circuit elements, such as signal generators, sensors, and antennas. However, there can be many instances where having digital signals or values can be beneficial, such as for a processing or storing of the signals or values. To utilize the benefits of having a digital signal or value when an analog signal or value has been produced, analog-to-digital converters (ADCs) have been developed to convert the analog signal or value into a digital signal or value.

A signal may be a time-based sequence of values. A digital value may be represented by a code. A name of a code (for example, CODE1) may refer to a digital value represented by the code. Some (but not all) digital values may be represented by codes using binary-weighted encoding. A resolution of a digital value or code expressed in terms of a number of bits may refer to a binary-weighted encoding, regardless of how it may be encoded.

In many electronics applications, analog input values are converted to digital output values (for example, for further digital processing or storage). For instance, in precision measurement systems, electronics are provided with one or more sensors to make measurements, and these sensors may generate analog values. The analog values may be provided as an input to an ADC to generate digital output values for further processing or storage.

ADCs can be found in many places such as broadband communication systems, automated test equipment, audio systems, vehicles, factory automation systems, etc. ADCs can translate analog electrical values representing real-world phenomena, e.g., light, sound, temperature, flow, or pressure. Designing an ADC is a non-trivial task because each application may have different needs in speed, performance, power, cost and size. As the applications needing ADCs grow, the need for accurate and reliable conversion performance also grows.

Some applications may require precise and accurate conversion of analog values, creating a need for precision ADCs (precision meaning precise and/or accurate). Required specifications for a precision ADC may include low noise and a small and stable offset. A constant-zero offset may be ideal. ADCs and other circuits may be designed aiming for a constant-zero offset, but imperfections of a manufacturing process, mismatch of nominally-identical semiconductor devices, atom-level charge mobility, etc. may cause a circuit's offset to be potentially non-zero and it may drift with respect to parameters such as time, temperature, and/or supply voltage. Auto-zeroing (AZ) circuits may be used in precision ADCs to stabilize (i.e., reduce and/or substantially prevent drift of) a potentially non-zero offset. An offset of an auto-zeroing circuit may be substantially zero (such as less than 100 micro-volts including drift). However, legacy AZ circuits may increase a level of broadband noise, which is detrimental when low noise and low power is also desired. A power consumption of a precision ADC may have to be increased to reduce noise to an acceptable level when an AZ circuit is used. There is a need for low-power ADCs, including a need for low-power, low-offset, and low-noise precision ADCs.

Several types of AZ circuits have been developed. FIG. 1 shows a prior art AZ amplifier circuit 120. AZ amplifier circuit 120 may operate in two phases: phase 1 (labeled φ1 in FIG. 1) and phase 2 (labeled φ2 in FIG. 1). Phase 1 and phase 2 are non-overlapping in time, and an operation may repeat periodically or non-periodically. Switches 113 and 107 are closed (conductive) during phase 1 and they are otherwise open (non-conductive). Likewise, switches 115p, 115m are closed during phase 2 and they are otherwise open. A voltage-in-voltage-out amplifier circuit 121 has two input terminals 103p, 103m and two output terminals 105p, 105m. In one example, terminals 103m and 105m are connected and share a common potential, such as ground or 0V. In phase 1, input terminals 103p, 103m are shorted by a switch 107, which establishes a nominally zero voltage across input terminals 103p, 103m. Amplifier circuit 121 has a potentially non-zero offset, such as OS=1 mV. An amplified offset may be observed at terminals 105p, 105m when switch 107 is closed during phase 1. For example, if amplifier circuit 121 has a factor of voltage gain, GAIN=200, then an amplified offset GAIN·OS=200·1 mV=200 mV is observed as a voltage between output terminals 105p and 105m. Note that offset OS may be an unwanted artifact of amplifier circuit 121, and that AZ amplifier circuit 120 need not include any circuitry for intentionally providing a non-zero offset OS. Accordingly, FIG. 1 does not (and should not) show a source or any other circuitry for providing or representing the offset OS, which may be (but need not be) nominally zero. An amplified non-zero offset may be observed as a non-zero voltage between terminals 105p, 105m even if the voltage between terminals 103p, 103m is exactly zero.

A capacitor 109 is configured between terminal 105p and a terminal 111p. A switch 113 shorts terminals 111p and 105m during phase 1, whereby an amplified offset may be observed as a voltage across capacitor 109. Switch 113 is opened slightly before switch 107 is opened in a transition from phase 1 to phase 2, whereby the observed amplified offset is sampled on capacitor 109. A voltage VRES (i.e., an analog value) applied to AZ amplifier circuit 120 at its input terminals 101p, 101m is provided to amplifier circuit 121 at terminals 103p, 103m via switches 115p, 115m that are closed during phase 2. If, on the one hand, (VRES>0) then a voltage greater than the amplified offset GAIN·OS is observed between terminals 105p and 105m, and a voltage greater than zero is observed between terminals 111p and 105m. If, on the other hand, (VRES<0) then a voltage less than the amplified offset GAIN·OS is observed between terminals 105p and 105m, and a voltage less than zero is observed between terminals 111p and 105m. Accordingly, a polarity of a voltage VRES applied at an input of AZ amplifier circuit 120 (terminals 101p, 101m) corresponds to a polarity of an amplified voltage GAIN·VRES observed at an output of AZ amplifier circuit 120 (terminals 111p, 105m). When the polarities correspond, an effective offset of AZ amplifier circuit 120 may be zero. An effective offset of AZ amplifier circuit 120 may be zero even if an offset OS of amplifier circuit 121 is non-zero. The described two-phase operation of AZ amplifier circuit 120 may substantially cancel (i.e., reduce to a small value, nominally zero) a potentially non-zero offset of amplifier circuit 121. A circuit, process, or operation that is configured to operate with a plurality of phases and substantially cancel a potentially non-zero offset may be referred to as an "auto-zeroing" circuit, process, or operation. Note that an auto-zeroing operation may require only very little or no knowledge of a circuit's potentially non-zero offset. An AZ circuit (e.g., AZ amplifier circuit 120) provides a nominal operation (e.g., amplification) during only one (e.g., phase 2) of a plurality of phases (e.g., phase 1 and phase 2) of its operation.

AZ amplifier circuit 120 exemplifies that an offset OS may be amplified and observed in one phase. A combination of an input VRES and an offset OS may be amplified and observed in another phase. AZ amplifier circuit 120 combines and outputs a combination of the two observations, whereby a combined contribution from the offset OS may be substantially zero. Specifically, a first observation, GAIN·OS, and a second observation, GAIN·(VRES+OS), are combined such that a contribution from the offset in one observation may be substantially cancelled by an equal-and-opposite (of equal magnitude and of opposite polarity) contribution from the offset in the other observation. For example, a combination of the two observations is GAIN·(VRES+OS)−GAIN·OS=GAIN·VRES. A contribution from the input VRES to the combined output is GAIN·VRES. A contribution from the offset OS to the combined output may be substantially zero, GAIN·(OS−OS)=0. An auto-zeroed offset may be nominally zero. AZ circuits may suppress low-frequency noise modeled as an offset drifting over time.

Successful operation of AZ amplifier circuit 120 in FIG. 1 depends on an observation sampled on capacitor 109 in phase 1 being substantially maintained during a subsequent phase 2. To achieve that, AZ amplifier circuit 120 is coupled to an amplifier (or buffer) circuit 117 configured to draw only very little if any charge from terminal 111p through capacitor 109 during phase 2. An offset of amplifier circuit 117 is suppressed by a factor of gain (such as GAIN=200) provided by AZ amplifier circuit 120 when it is referred to an input VRES. In some applications, amplifier circuit 117 is an auto-zeroing amplifier circuit, for example AZ amplifier circuit 120. In some implementations, capacitor 109 is split in two (not shown) and a first-half capacitor is configured in series with terminal 105p and a second-half capacitor is configured in series with terminal 105m.

FIG. 2 shows another prior art type of AZ amplifier circuit 220. A voltage-in-voltage-out amplifier circuit 221 subject to auto-zeroing has a pair of input terminals 203p and 203m and a pair of output terminals 205p and 205m. It furthermore has an auxiliary input 211 for applying an auxiliary (control) voltage. An effective (auto-zeroed) offset of AZ amplifier circuit 220 is a combination of a potentially non-zero offset of amplifier circuit 221 and an auxiliary voltage applied at input 211 to cancel a contribution from the offset. Amplifier circuit 221 is a 2-stage amplifier circuit that is well-known to persons having ordinary skill in the art (PHOSITA). It comprises an input gm-stage (i.e., a transconductance circuit, not shown) coupled to input terminals 203p and 203m and an output stage (e.g., a transresistance stage, not shown) coupled to output terminals 205p and 205m. An auxiliary gm-stage (not shown) is coupled to input 211 and to the input gm-stage. Currents provided by the input gm-stage and the auxiliary gm-stage are combined, such that a current provided by the auxiliary gm-stage may cancel an offset for the input gm-stage. An auxiliary voltage is sampled and stored on a capacitor 209 coupled to input 211. Capacitor 209 is not directly coupled to output terminals 205p, 205m. A first terminal of capacitor 209 connected to input 211 is substantially floating when a switch 213 is open. Output terminals 205p, 205m of amplifier circuit 221 are also output terminals of AZ amplifier circuit 220. An input impedance of an optional loading circuit 217 may be relatively unimportant, and AZ amplifier circuit 220 may be more versatile in use than AZ amplifier circuit 120 of FIG. 1 may be.

AZ amplifier circuit 220 operates in two phases: phase 1 (labeled ϕ1 in FIG. 2) and phase 2 (labeled ϕ2 in FIG. 2). During phase 1, a switch 207 is closed to apply a zero voltage across terminals 203p and 203m. An amplified combination of a potentially non-zero offset and an auxiliary voltage is observed as a voltage at terminals 205p, 205m, which is connected to a gm-stage (transconductance stage circuit) 223. Switch 213 couples gm-stage 223 to capacitor 209 and input 211 during phase 1. A polarity of the amplified combination nominally determines a polarity of current provided by gm-stage 223, which accordingly may increase or decrease the auxiliary voltage at input 211 during phase 1 when switch 213 is closed. A negative-feedback mode of operation ensures that the auxiliary voltage at input 211 is substantially settled at the end of phase 1 and the amplified combination at terminals 205p, 205m may be substantially zero.

Switch 213 is opened a period of time before switch 207 is opened in a transition from phase 1 to phase 2. That effectively samples the substantially settled auxiliary voltage on capacitor 209 and holds it at input 211 during phase 2. A switch 219 is closed during phase 2 to divert a current that may be provided by gm-stage 223. Alternatively, gm-stage 223 is temporarily turned off to save power during phase 2, and/or it is disconnected from terminals 205p, 205m by switches (not shown). An analog input value VRES is applied to AZ amplifier circuit 220 at input terminals 201p, 201m. The analog input value is provided to amplifier circuit 221 at terminals 203p, 203m via switches 215p, 215m that are closed during phase 2.

An operation of AZ amplifier circuit 220 is as follows. In phase 1, a negative-feedback operation regulates an auxiliary voltage such that an amplified combination of an offset and the auxiliary voltage is substantially zero at or near the end of phase 1 when the auxiliary voltage is sampled on capacitor 209. An amplified contribution from the sampled auxiliary voltage may be substantially equal-and-opposite an amplified contribution from the offset. The sampled auxiliary voltage is a first observation of the amplified offset.

In phase 2, amplifier circuit 221 amplifies a combination of an input VRES, an offset, and the sampled auxiliary voltage. The amplified combination is observed and output at terminals 205p, 205m. A contribution from the offset to the amplified combination may be substantially equal-and-opposite a contribution from the sampled auxiliary voltage to the amplified combination, and the two contributions may substantially cancel each other at terminals 205p, 205m. That is an auto-zeroing operation. Accordingly, the amplified combination observed and output at terminals 205p, 205m is responsive to VRES and substantially not responsive to an offset of amplifier circuit 221. The sampled auxiliary voltage is a first observation of the amplified offset, and it is combined with a second observation of the amplified offset made during phase 2.

Various types of auto-zeroing amplifiers are known in the prior art. A common property is that they operate in a plurality of phases, and that a nominally zero voltage is applied at an input during one of the plurality of phases of operation. Another common property is that observations made during the plurality of phases are combined to substantially cancel a potentially non-zero offset.

An auto-zeroing amplifier may be configured to amplify a residue value in an analog-to-digital converter (ADC) circuit. FIG. 3 shows a block diagram of an ADC 300 comprising a residue amplifier 320. In some examples, residue amplifier 320 is an AZ amplifier circuit 220 shown in FIG. 2. ADC 300 receives an analog voltage VIN(t). A sample-and-hold (S/H) circuit 301 samples VIN(t) at a sampling instant (t=T0) and outputs a held analog value VIN. A first quantizer (ADC1) 303 is configured to receive analog value VIN and derive a first digital value (CODE1) representing VIN. Digital value CODE1 is a relatively low-resolution digital representation of VIN. For example, CODE1 may be a 5-bit digital representation of VIN. ADC 300 derives and processes a residue of VIN with respect to CODE1 as a step of a method to derive a higher resolution and more precise digital representation of VIN. Specifically, a digital-to-analog converter (DAC) 305 derives an analog representation of CODE1, and a difference between VIN and the analog representation of CODE1 is a residue value VRES. The residue value VRES is amplified by residue amplifier 320, and a second quantizer (ADC2) 330 is configured to derive a digital representation CODE2 of the residue value VRES accounting for a factor of gain A provided by residue amplifier 320. A combination of CODE1 and CODE2 is a high-resolution precision representation of VIN.

A degree of precision that can be achieved by ADC 300 may depend substantially on a degree of precision that is achieved by DAC 305 and by residue amplifier 320. For comparison, a degree of precision of ADC1 303 may be relatively much less important, provided CODE2 is an accurate representation of the residue value VRES. A degree of precision needed from ADC2 330 is less than the overall degree of precision provided by ADC 300, provided an absolute value of gain factor A of residue amplifier 320 is larger than 1. An upper limit for gain factor A depends on a resolution and precision of CODE1 representing VIN. For example, a gain factor A=16 is used if CODE1 is of 5-bit resolution and of a precision that will not cause overload/saturation of residue amplifier 320 and/or ADC2 330.

For clarity, ADC1 and/or ADC2 may be referred to as "quantizers" as an alternative to ADCs. PHOSITA recognize that ADC2 330 in FIG. 3 may be implemented as ADC 300 of FIG. 3, in an overall recursive-type structure. A so-called pipelined ADC is a well-known example of an ADC 300 where ADC2 330 is a cascade of several similar stages.

The block diagram of ADC 300 in FIG. 3 represents any one of several types of analog-to-digital converters comprising a residue amplifier 320. For example, ADC 300 may be a so-called hybrid-SAR ADC, where CODE1 is derived at least in part by using a successive-approximation-type algorithm (PHOSITA recognize that SAR ADC stands for "successive-approximation-register analog-to-digital converter". PHOSITA are familiar with the design and operation of SAR ADCs). In another example, CODE1 is derived by a flash-type ADC1 303 configured to receive VIN. In other examples, CODE 1 is provided by a flash or other type of ADC configured to receive VIN(t) and an operation (e.g., an operation to sample VIN(t)) is synchronized with that of S/H circuit 301. In yet other examples, ADC1 303 in FIG. 3 is a SAR quantizer, a hybrid-SAR quantizer, a VCO-based quantizer, a two-step quantizer, a multi-step quantizer, or a pipelined quantizer providing a digital value CODE1 that is a relatively high-resolution representation of VIN (such as CODE1 may be of 10-bit or higher resolution). Accordingly, ADC1 303 in FIG. 3 is a representation of some type of circuit or some type of method to provide a digital representation CODE1 of VIN. The ADC 300 derives an analog residue value VRES as a difference of an analog representation of a digital value CODE1 and an analog value VIN. In one example, a capacitive digital-to-analog converter (CDAC) circuit receives the analog value VIN and the digital value CODE1, and produces the analog residue value VRES based from the analog value VIN and the digital value CODE1. A terminology may be that VRES is a residue of VIN with respect to CODE1, or equivalently (changing polarity) that VRES is a residue of CODE1 with respect to VIN. A magnitude and other properties of residue VRES depend on how CODE1 may be derived to represent VIN, particularly including (but not limited to) a resolution and precision of CODE1.

A degree of precision that can be achieved by ADC 300 depends substantially on a degree of precision that may be achieved by DAC 305 and residue amplifier 320. Some approaches include deriving VIN by sampling a combination of an analog input value VIN(t) and an analog dither value. The approaches may generalize an operation of S/H circuit 301 and DAC 305, which are combined via a capacitive digital-to-analog converter (CDAC) circuit. In another approach, a high-resolution digital value CODE1 is derived that allows for a high factor of gain A of the residue amplifier 320 (if so desired). Accordingly, many variations of ADC circuits may be configured to incorporate a low-offset residue amplifier circuit described herein.

FIG. 4 shows an example ADC 400 that corresponds to the block diagram of FIG. 3. It is a differential ADC 400 receiving an analog input voltage difference VIN(t)=Vp(t)−Vm(t) at input terminals 401p and 401m. During an acquisition phase (labeled φ0 in FIG. 4) switches 403p, 403m, 405p, 405m are closed, and the analog input voltage is applied to capacitor arrays 407p, 407m. At a sampling instant (t=T0) at or near the end of the acquisition phase, sampling switches 405p, 405m are opened to isolate a differential charge quantity at nodes 409p, 409m. Input switches 403p, 403m are opened a short delay (such as 200 pico-seconds) after the sampling instant. Capacitor arrays 407p, 407m are a part of a CDAC structure. PHOSITA are familiar with CDAC structures. Capacitor array 407p has a shared terminal connected to terminal 409p and a plurality of N1 terminals connected to input switch 403p (compare to FIG. 2 of U.S. Pat. No. 8,810,443). Accordingly, input switch 403p may be an array of switches, having a shared terminal connected to input terminal 401p, and a plurality of N1 terminals connected to capacitor array 407p. The same may apply for 407m, 409m, 403m, and 401m.

FIG. 4 shows in part a first quantizer ADC1 implemented as a pair of quantizers, ADC1p 411p and ADC1m 411m, configured to individually process each voltage, Vp(t) and Vm(t), applied at the input terminals 401p, 401m (each voltage is observed with respect to a predefined potential, such as ground or 0V). Quantizers 411p and 411m sample Vp(t) and Vm(t) at a sampling instant (t=T0) when sampling switches 405p, 405m are opened. Accordingly, a plus-input digital value CODE1p represents a value Vp(T0) of Vp(t) at the sampling instant, and a minus-input digital value CODE1m represents a value Vm(T0) of Vm(t) at the sampling instant. A plus-to-minus digital value CODE1=CODE1p−CODE1m represents an analog input value VIN=Vp(T0)−Vm(T0) at the sampling instant. In another embodiment, a single differential quantizer ADC1 is configured to provide a digital value CODE1 to represent VIN=Vp(T0)−Vm(T0), without necessarily processing each input Vp(t) and Vm(t) individually.

The derived digital values CODE1p is applied via switches 413p, 415p so that an analog value (e.g., a voltage) at terminal 409p is a residue VRESp of Vp(T0) with respect to CODE1p. Likewise, CODE1m is applied via switches 413m, 415m so that an analog value (e.g., a voltage) at terminal 409m is a residue VRESm of Vm(T0) with respect to CODE1m. Switches 413p, 413m connect individual capacitors in capacitor arrays 407p, 407m to a first/high reference potential VH responsive to individual bits of CODE1p and CODE1m. Likewise, switches 415p, 415m connect individual capacitors in capacitor arrays 407p, 407m to a second/low reference potential VL responsive to individual bits of CODE1p and CODE1m. A capacitor in capacitor array 407p or capacitor array 407m is connected to either VH or VL responsive to a bit of CODE1p or CODE1m. The term capacitive digital-to-analog converter (CDAC) may be used to describe capacitor arrays 407p, 407m and pertinent switches and reference potentials.

Accordingly, an analog value is sampled on a CDAC (e.g., Vp(T0) is sampled on one or more capacitors in capacitor array 407p via switches 403p and 405p); a digital value is applied to a CDAC (e.g., switches 413p, 415p selectively connect individual capacitors of capacitor array 407p to reference potentials VH or VL responsive to CODE1p); and a CDAC provides an analog value that is a residue of a sampled analog value with respect to a digital code (e.g., a potential/voltage at node 409p is a residue VRESp of Vp(T0) with respect to CODE1p).

A residue amplifier 420 is configured to receive a residue value VRES=VRESp−VRESm (e.g., a voltage between nodes 409p and 409m) representing a residue of an analog value VIN=Vp(T0)−Vm(T0) with respect to a digital value CODE1=CODE1p−CODE1m. The residue amplifier 420 provides an amplified residue value A·VRES that is processed by a quantizer circuit ADC2 430. ADC2 430 is configured to provide a digital value CODE2 representing a residue VRES of VIN=Vp(T0)−Vm(T0) with respect to CODE1=CODE1p−CODE1m accounting for a factor of gain A provided by the residue amplifier 420. A digital circuit 440 combines CODE1p, CODE1m, and CODE2 to provide a digital output code DOUT that may be a high-resolution representation of VIN=Vp(T0)−Vm(T0). For example, ADC 400 provides an output code DOUT that is of 20-bit or 24-bit resolution. To achieve a high degree of precision, digital circuit 440 optionally receives and processes calibration information. Calibration information includes a plurality of codes representing capacitance ratios for capacitors in capacitor arrays 407p, 407m. Calibration information is obtained/measured as part of a manufacturing process and it is stored in a memory device (not shown). A degree of precision that can be achieved by ADC 400 is substantially limited by an offset and a level of noise of residue amplifier 420. A legacy AZ residue amplifier (e.g., AZ amplifier circuit 220 of FIG. 2) may provide good offset stability, but at a relatively high/poor noise level. For comparison, a non-auto-zeroing residue amplifier may provide a relatively lower/better noise-and-power operation, but its offset stability may be relatively poor.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

SUMMARY OF THE DISCLOSURE

Figure 1:
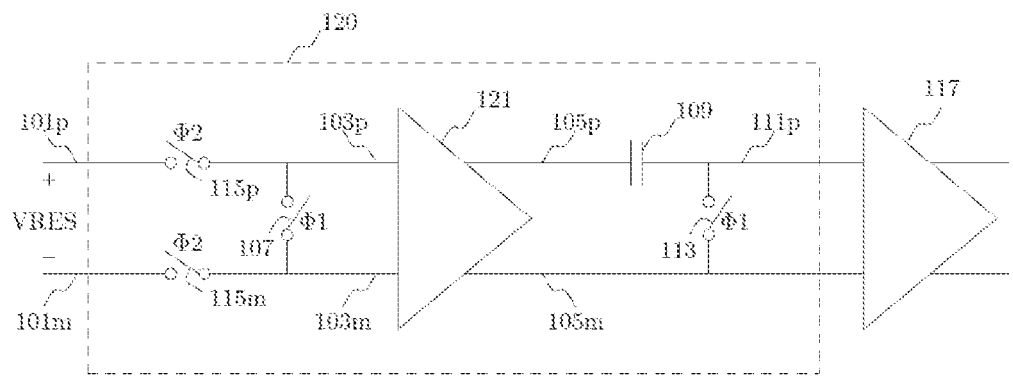
FIG. 1 shows a prior art AZ amplifier circuit.

Disclosed herein are some examples of analog-to-digital converters (ADCs) that can perform auto-zeroing with amplifying a signal for improvement of a signal-to-noise ratio. The ADCs may produce a first digital code to represent an analog input signal and a second digital code based on a residue from the first digital code, and may combine the first digital code and the second digital code to produce a digital output code to represent the analog input signal. The ADC may utilize a first observation and a second observation of an analog residue value representing the residue to produce the second digital code.

Some embodiments disclosed herein may include an analog-to-digital converter (ADC) circuit, comprising a sampling-quantizing-residue-generating (SQRG) circuit, an auto-zeroing residue amplification circuit, a quantizer circuit, and a digital circuit. The sampling-quantizing-residue-generating (SQRG) circuit may produce a first digital code based at least in part on an analog input value received by the ADC circuit, and produce an analog residue value based at least in part on the first digital code and the analog input value. The auto-zeroing residue amplification circuit may amplify the analog residue value, produce a first observation of the amplified analog residue value; and produce a second observation of the amplified analog residue value. The quantizer circuit may produce a second digital code, the second digital code representative of a combination of at least the first observation and the second observation. The digital circuit to produce a digital output code, the digital output code to represent the analog input value, wherein the first digital code and the second digital code are combined to produce the digital output code.

Some embodiments disclosed herein may include an auto-zeroing residue amplification circuit for cancellation of an offset, the auto-zeroing residue amplification circuit comprising an amplification circuit and one or more switches.

The amplification circuit to amplify a first observation of an analog residue value received by the auto-zeroing residue amplification circuit and a second observation of the analog residue value, the analog residue value being a residue of a digital code produced from analog-to-digital conversion of an analog input value, wherein the amplified first observation and the amplified second observation are to be utilized with the digital code to produce a digital output code that represents the analog input value. The one or more switches coupled between the amplification circuit and an input of the auto-zeroing residue amplification circuit, the analog residue value received via the input of the auto-zeroing residue amplification circuit, wherein the one or more switches are to selectively apply the first observation and the second observation to the amplification circuit.

An auto-zeroing residue amplifier may be configured to operate in two phases, wherein an input residue value may be amplified and observed in both phases. Similar to a legacy auto-zeroing amplifier, the two observations may be combined to substantially cancel a potentially non-zero offset of an active circuit configured to provide amplification. It may be advantageous to have the two observations closely spaced in time. However, unlike legacy auto-zeroing amplifiers, both observations include an amplified residue value. Consequently, the combined observations of the amplified residue value comprise a relatively higher level of signal (residue value) compared to a noise level. A noise level may be normalized by a signal level, and a relative noise level may be substantially lower than that of a legacy auto-zeroing residue amplifier circuit. The relatively lower noise level facilitates implementing ADCs with a substantially reduced noise-and-power operation, which is a significant improvement.

DETAILED DESCRIPTION

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples, or in some cases across different figures. This repetition is for the purpose of simplicity and clarity and does not in itself dictate a specific relationship between the various embodiments and/or configurations discussed. Different embodiments may have different advantages, and no particular advantage is necessarily required of any embodiment.

Figure 3:
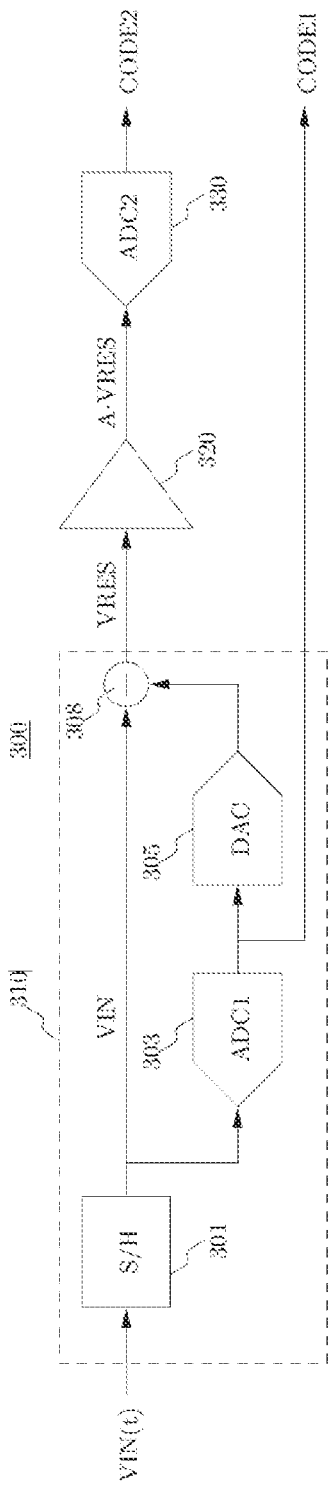
FIG. 3 shows a block diagram of an ADC comprising a residue amplifier.
Figure 4:
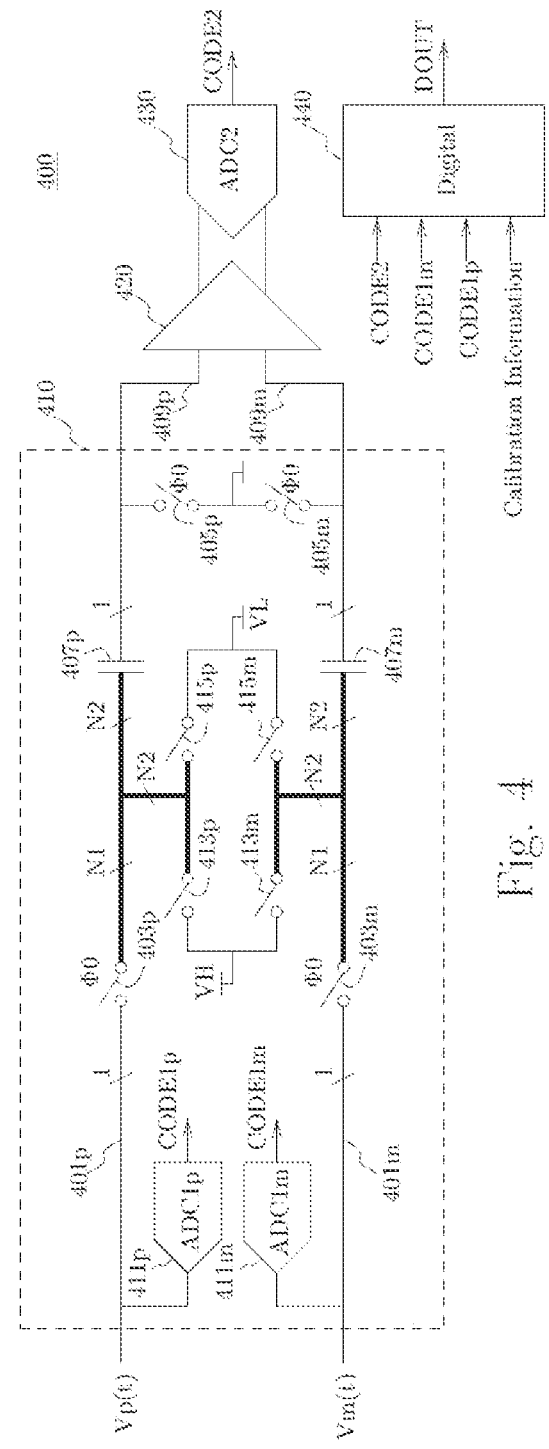
FIG. 4 shows an example ADC that corresponds to the block diagram of FIG. 3.
Figure 5:
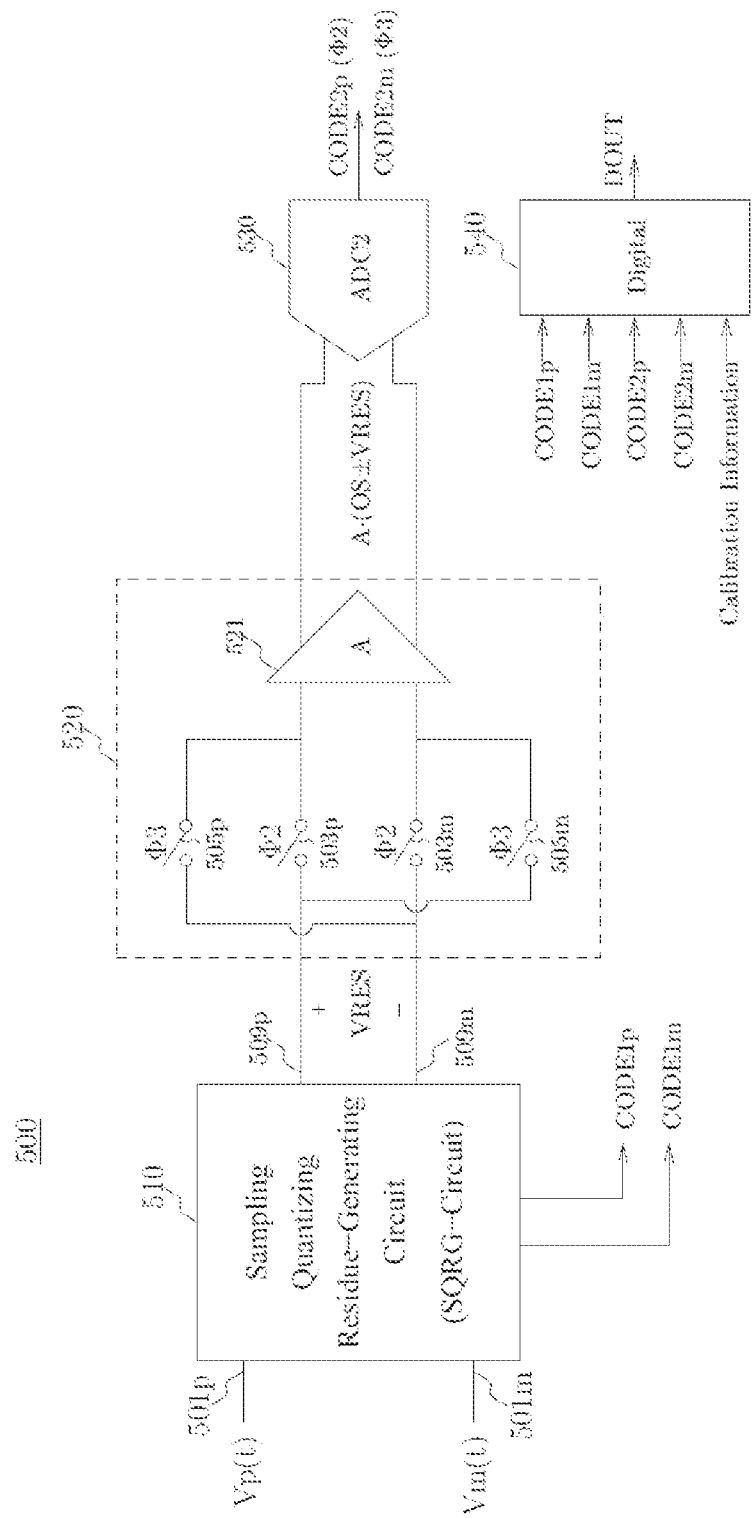
FIG. 5 shows an example first embodiment of an ADC circuit including an auto-zeroing residue amplification circuit according to various embodiments.

FIG. 5 shows an example first embodiment of an ADC circuit 500 including an auto-zeroing residue amplification circuit 520 according to the present teaching. A sampling-quantizing-residue-generating circuit (SQRG circuit) 510 may be implemented, where the SQRG circuit 510 may include one or more of the features of the SQRG circuit 410 of FIG. 4. A function of the SQRG circuit may be similar to the function of the portion of the ADC 300 indicated by 310 in FIG. 3. Terminal 501p and terminal 501m in FIG. 5 may correspond to terminal 401p and terminal 401m in FIG. 4, respectively. Further, terminal 509p and terminal 509m may correspond to terminal 409p and terminal 409m, respectively. Accordingly, SQRG circuit 510 may provide an analog residue value VRES representing a residue of an analog input value VIN=Vp(T0)−Vm(T0) with respect to a first digital value CODE1=CODE1p−CODE1m, where T0 is a particular time that a sample is produced. For example, the SQRG circuit 510 may receive an analog input value VIN via terminal 501p and terminal 501m, where the analog input value VIN comprises a differential voltage in the illustrated embodiment, and where a voltage provided via terminal 501p may comprise a positive component of the differential voltage and a voltage provided via terminal 501m may comprise a negative component of the differential voltage. The SQRG circuit 510 may include an ADC1 (such as the ADC1 303 (FIG. 3)) that produces the first digital value CODE1 based on the analog input value VIN. In the illustrated embodiment, the first digital value CODE1 may be represented by a positive digital component value CODE1p that represents the positive component of the differential voltage of the input value VIN and a negative digital component value CODE1m that represents the negative component of the differential voltage of the analog input value VIN. The SQRG circuit 510 may output the first digital value CODE1. In the illustrated embodiment, the first digital value CODE1 that is output by the SQRG circuit 510 may comprise the positive digital component value CODE1p and the negative digital component value CODE1m.

The SQRG circuit 510 may further include a DAC (such as the DAC 305 (FIG. 3)) that is to produce an analog representation of the first digital value CODE1. For example, the DAC may receive the first digital value CODE1 from the ADC1 and a produce an analog representation of the first digital value CODE1. In the illustrated embodiment where the first digital value CODE1 is represented by the positive digital component value CODE1p and the negative digital component value CODE1m, the DAC may receive the positive digital component value CODE1p and the negative digital component value CODE1m, and may produce an analog representation of the positive digital component value CODE1p and an analog representation of the negative digital component value CODE1m to form the analog representation of the first digital value CODE1.

The SQRG circuit 510 may further include subtractor circuitry (such as the subtractor circuitry 308 (FIG. 3)) to produce a residue value VRES between the analog input value VIN and the analog representation of the first digital value CODE1. In particular, the subtractor circuitry 308 may receive the analog input value VIN and the analog representation of the first digital value CODE1, and produce the residue value VRES from the analog input value VIN and the analog representation of the first digital value CODE1. The residue value VRES may be output by the SQRG circuit 510. In the illustrated embodiment, the residue value VRES may be output as a positive analog component value at terminal 509p and a negative analog component value at terminal 509m, where the positive analog component value and the negative analog component value form a differential representation of the residue value VRES. The residue value VRES may be provided by the SQRG circuit 510 to an auto-zeroing residue amplification circuit 520 of the ADC circuit 500. In another embodiment, digital value CODE1 may be provided as a single code and not as a pair of codes (CODE1p, CODE1m). In another embodiment, VRES may be a residue of CODE1 with respect to a combination of an analog input value Vp(T0)−Vm(T0) and a dither value. A resolution of CODE1 may be relatively low (such as 5-bits or less), medium, or relatively high (such as 10-bits or more) depending on a set of design objectives.

Auto-zeroing residue amplification circuit 520 may operate in two phases (a phase 2 and a phase 3). The illustrated auto-zeroing residue amplification circuit 520 includes indications of which switches are closed during which phase, where switches with the label ϕ2 above the switch are closed during phase 2 and open during phase 3, and where switches with the label ϕ3 above the switch are closed during phase 3 and open during phase 2. For example, switch 503*p* and switch 503*m* may be closed during phase 2 and open during phase 3. Switch 505*p* and switch 505*m* may be open during phase 2 and closed during phase 3. Phase 2 may occur during a first time period and phase 3 may occur during a second time period, where the first time period and the second time period may be non-overlapping in time. Phase 2 and phase 3 may be repeated periodically or non-periodically.

An active circuit configured to provide amplification circuit 521 may, during phase 2, receive as input a first polarity of the analog residue value (such as +VRES). For example, during phase 2, switch 503*p* and switch 503*m* may be closed, while switch 505*p* and 505*m* may be open. Switch 503*p* and switch 503*m* may couple the SQRG circuit 510 to the amplification circuit 521. The SQRG circuit 510 may provide an analog residue value VRES to the amplification circuit 521 via the switch 503*p* and the switch 503*m*, where a positive analog component value of the analog residue value VRES is provided to a first input of the amplification circuit 521 via the switch 503*p* and a negative analog component value of the analog residue value VRES is provided to a second input of the amplification circuit 521 via the switch 503*m*. Furthermore, during phase 3, the active circuit may receive as input a second polarity opposite the first polarity of the analog residue value (such as −VRES). For example, during phase 3, switch 505*p* and switch 505*m* may be closed, while switch 503*p* and switch 503*m* may be open. Switch 505*p* and switch 505*m* may couple the SQRG circuit 510 to the amplification circuit 521. The SQRG circuit 510 may provide the analog residue value VRES to the amplification circuit 521 via the switch 505*p* and the switch 505*m*, where a positive analog component value of the analog residue value VRES is provided to the second input of the amplification circuit 521 via the switch 505*m* and a negative analog component value of the analog residue value VRES is provided to the first input of the amplification circuit 521 via the switch 505*p*.

The amplification circuit 521 may produce a first amplified combination A·(OS+VRES) of the residue value VRES and a potentially non-zero offset OS during phase 2, and the amplification circuit 521 may produce a second amplified combination A·(OS−VRES) thereof during phase 3. For example, the amplification circuit 521 may provide the first amplified combination A·(OS+VRES) to ADC2 530 at or near the end of phase 2 and the amplification circuit 521 may provide the second amplified combination A·(OS−VRES) to the ADC2 530 at or near the end of phase 3. In this embodiment, AZ amplification circuit 520 does not itself combine the two amplified combinations A·(OS+VRES) and A·(OS−VRES).

The two amplified combinations are available/observable at two distinct phases of an operation (phase 2 and phase 3) and not at the same time. For example, the first amplified combination A·(OS+VRES) may be available/observable at the output of the amplification circuit 521 at or near an end of phase 2 and the second amplified combination A·(OS−VRES) may be available/observable at the output of the amplification circuit 521 at or near an end of phase 3. The ADC2 530 may observe the first combination A·(OS+VRES) at or near the end of phase 2 and the ADC2 530 may produce a digital value CODE2p to represent A·(OS+VRES). ADC2 530 may further observe the second combination A·(OS−VRES) at or near the end of phase 3 and it may produce a digital value CODE2m to represent A·(OS−VRES). The ADC2 530 may provide the positive digital component value CODE2p and the negative digital component value CODE2m at different times in a sequence corresponding to when each of the digital values is observed by the ADC2 530.

ADC circuit 500 may combine the two observations of the amplified residue. In the illustrated embodiment, a digital circuit 540 may be coupled to the ADC2 530 at the output of the ADC2 530 and may receive the positive digital component value CODE2p and the negative digital component value CODE2m from the ADC2 530. The two observations (represented by the positive digital component value CODE2p and the negative digital component value CODE2m produced by the ADC2 530), which may be quantized individually by ADC2 530, may be combined numerically by the digital circuit 540 configured to calculate a digital value CODE2=CODE2p−CODE2m. A potentially non-zero offset OS of amplification circuit 521 may be substantially cancelled in CODE2 when CODE2p and CODE2m are combined by a subtraction. That may be an auto-zeroing operation. CODE2 may represent an amplified analog residue value 2·A·VRES, or it may be scaled by a nominal amplification factor 2·A to represent VRES. By cancelling out the potentially non-zero offset OS and having the analog residue value VRES amplified, the auto-zeroing residue amplification circuit 520 may produce an improved signal-to-noise representation of the analog residue value VRES while maintaining or reducing the power consumption of the ADC 500 as compared to legacy ADCs with auto-zeroing. This can result in improvement in operation of the ADC and/or less power consumption of the ADC as compared to legacy ADCs.

The digital circuit 540 may be configured to derive a high-resolution representation DOUT of the analog input value VIN=Vp(T0)−Vm(T0) by calculating DOUT=CODE1p−CODE1m+(CODE2p−CODE2m)/(2·A). In another embodiment, digital circuit 540 may be configured to calculate DOUT=CODE1p−CODE1m+CODE2p−CODE2m. For example, the digital circuit 540 may be coupled to the SQRG circuit 510 and may receive the first digital code CODE1 representing the analog signal VIN from the SQRG circuit 510. The digital circuit 540 may further be coupled to the ADC2 530 and may receive the digital value CODE2 from the ADC2 530. In the illustrated embodiment where the first digital code CODE1 and the digital value CODE2 are represented differentially, the digital circuit 540 may receive the positive digital component value CODE1p and the negative digital component value CODE1m to represent the first digital code CODE1, and may receive the positive digital component value CODE2p and the negative digital component value CODE2m to represent the digital value CODE2. The digital circuitry may produce the output code DOUT of the analog input value VIN by either of the equations for calculating the output code DOUT. Output code DOUT may be also responsive to calibration information. Calibration information may include codes representing potential mismatch of an amplification factor A and/or potential mismatch of parameters for SQRG circuit 510 and/or ADC2 530. Calibration information may be derived during a production process (e.g., production test), or it may be derived by a foreground and/or background calibration process during operation while ADC circuit 500 may be deployed for use in an application (e.g., factory automation).

In another embodiment, ADC2 530 may be implemented as two individual quantizers. A first quantizer ADC2p (not shown) may observe A·(OS+VRES) at or near the end of phase 2 and provide a digital value CODE2p to represent A·(OS+VRES). Another quantizer ADC2m (not shown) may observe A·(OS-VRES) at or near the end of phase 3 and provide a digital value CODE2m to represent A·(OS-VRES). CODE1p, CODE1m, CODE2p, CODE2m may be combined as described above. A potential advantage of using two separate quantizers to implement ADC2 may be that the two observations may be made with less separation in time. That may improve a suppression of low-frequency noise from amplification circuit 521.

Figure 2:
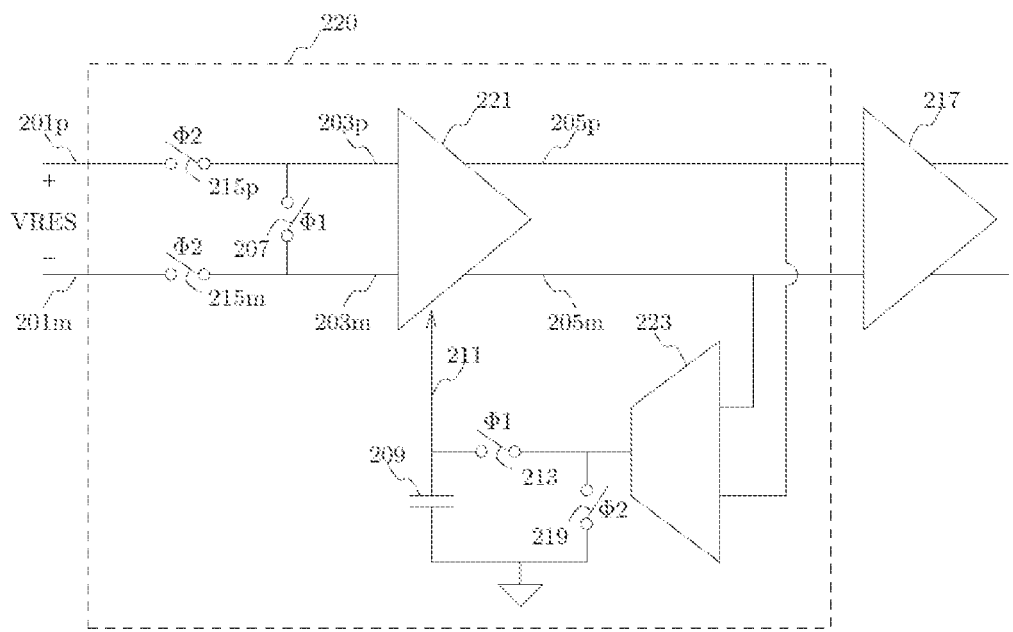
FIG. 2 shows another prior art type of AZ amplifier circuit.

An advantage of AZ residue amplification circuit 520 may be easily missed. The two observations that may be made to derive CODE2 both represent an amplified residue value (A·VRES) in combination with an amplified offset (A·OS). Compare that to the operation of a legacy AZ amplifier (e.g., as shown in FIGS. 1 and 2) wherein only one of the two observations include an amplified residue value (A·VRES) and both observations include an amplified offset (A·OS). A payload-signal content (VRES) may be substantially higher (better) for AZ amplification circuit 520 compared to that of a legacy AZ amplifier. Each observation may be impacted by broadband noise in part from the active circuit configured for amplification (amplification circuit 521 in FIG. 5; amplification circuit 121 in FIG. 1; amplification circuit 221 in FIG. 2). A signal-to-noise ratio (residue-to-noise ratio) may be superior when a residue value VRES is amplified as shown in FIG. 5 for ADC circuit 500. An improved signal-to-noise ratio may enable a very significant (such as nearly 4 times) reduction of a power consumption of AZ residue amplification circuit 520 compared to that of a legacy AZ residue amplification circuit (120 in FIG. 1; 220 in FIG. 2) for a given noise specification. Accordingly, in one embodiment, the present teaching facilitates reducing significantly a power consumption of a precision ADC. In another embodiment, the present teaching facilitates improving significantly a signal-to-noise ratio of a precision ADC for a given power budget (such as 20 mW).

Figure 6:
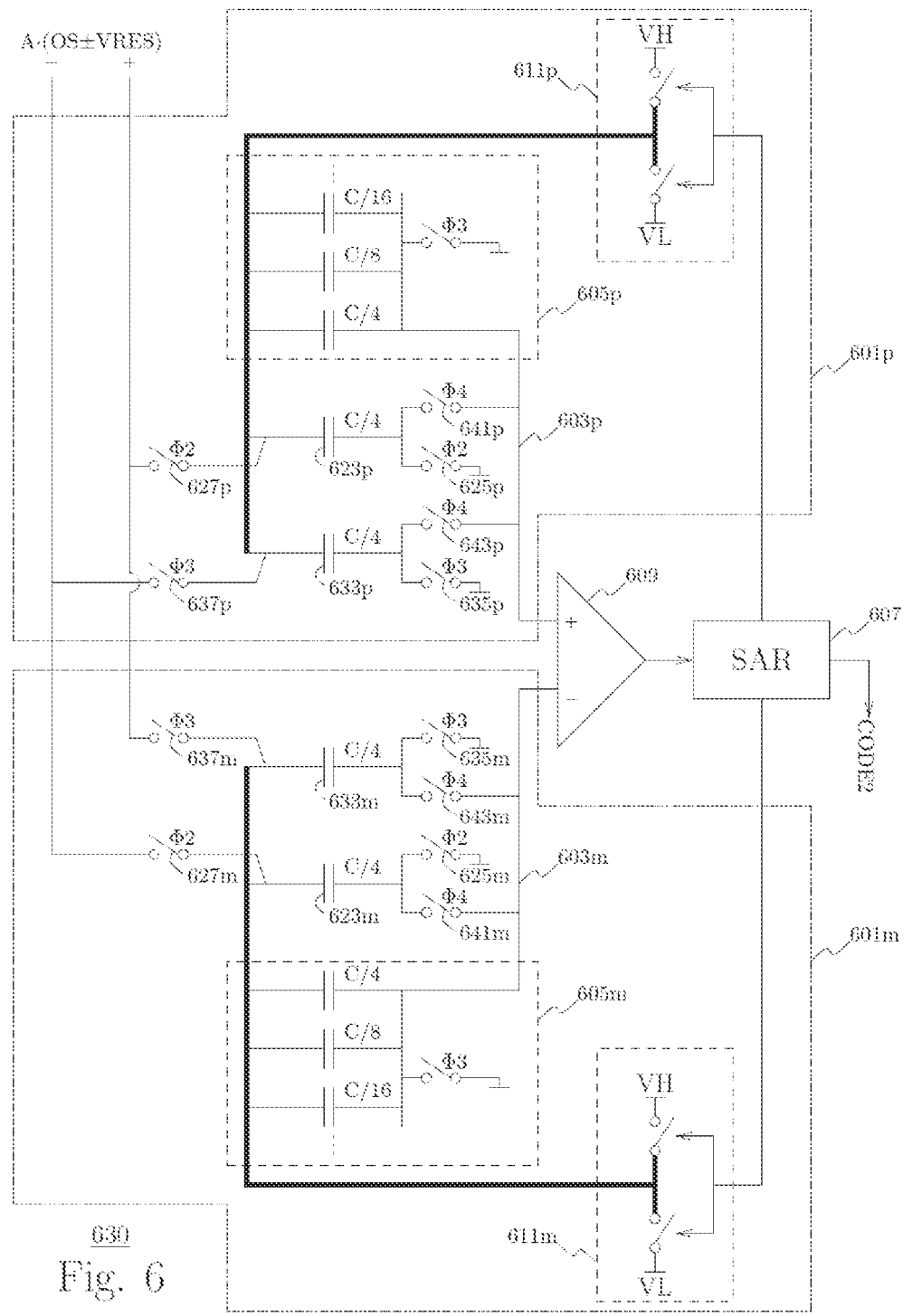
FIG. 6 shows an example quantizer ADC2 that may be used in place of the ADC2 in FIG. 5 according to various embodiments.

FIG. 6 shows an example quantizer ADC2 630 that may be used in place of ADC2 530 in FIG. 5. ADC2 630 may combine two observations in the analog domain, and it may perform a single analog-to-digital (A/D) conversion operation to derive a digital value CODE2 to represent a combination of the two observations. Accordingly, when implemented in place of the ADC2 530 in the ADC circuit 500, the ADC2 630 may receive amplified combinations (such as the first amplified combination A·(OS+VRES) and the second amplified combination A·(OS-VRES)) and may output a digital value CODE2 that represents a combination of the amplified combinations.

ADC2 630 may be a fully differential structure comprising a plus-side CDAC 601p and a minus-side CDAC 601m. A first observation may be made of an amplified analog residue value, such as A·(OS+VRES), provided to the ADC2 630 by AZ residue amplifier circuit 520 in FIG. 5. The first observation may be sampled on capacitor 623p and capacitor 623m at or near the end of a phase 2 (where the switches to be closed during phase 2 are labeled with φ2 in FIG. 6 and may be consistent with φ2 in FIG. 5) when sampling switch 625p and sampling switch 625m open at or near the end of phase 2. Connecting switch 627p and connecting switch 627m may be opened a small delay (such as 200 ps) after sampling switch 625p and sampling switch 625m open.

A second observation may be made of an amplified analog residue value, such as A·(OS-VRES), provided to the ADC2 630 by AZ residue amplifier 520 in FIG. 5. The second observation may be sampled on capacitor 633p and capacitor 633m at or near the end of a phase 3 (where the switches to be closed during phase 3 are labeled with φ3 in FIG. 6 and may be consistent with φ3 in FIG. 5) when sampling switch 635p and switch 635m open at or near the end of phase 3. The sampling of the second observation may have an opposite polarity with respect to the plus-side CDAC 601p and the minus-side CDAC 601m as compared to the first observation. In particular, the amplified analog residue value of the first observation and the amplified analog residue value of the second observation may each be represented by differential voltage. Having the switch 627p and the switch 627m closed during phase 2 may cause the positive component of the differential voltage of the first observation to be sampled on the capacitor 623p of the plus-side CDAC 601p and the negative component of the differential voltage of the first observation to be sampled on the capacitor 623m of the minus-side CDAC 601m. Having the switch 637p and the switch 637m closed during phase 3 may cause the negative component of the differential voltage of the second observation to be sampled on the capacitor 633p of the plus-side CDAC 601p and the positive component of the differential voltage of the second observation to be sampled on the capacitor 633m of the minus-side CDAC 601m. Accordingly, the polarities of first observation and the second observation may be opposite with respect to the plus-side CDAC 601p and the minus-side CDAC 601m due to the positive components and negative components of the differential voltages of the observations being swapped between the plus-side CDAC 601p and the minus-side CDAC 601m between phase 2 and phase 3. Connecting switch 637p and connecting switch 637m may be opened a small delay (such as 200 ps) after sampling switch 635p and sampling switch 635m open. ADC2 630 may implement a SAR-type ADC conversion operation during a phase 4 (where the switches to be closed during phase 4 are labeled φ4 in FIG. 6) following phase 2 and phase 3.

Phase 2, phase 3, and phase 4 may be non-overlapping in time, and they may be repeated periodically or non-periodically. For example, phase 2 may occur during a first time period, phase 3 may occur during a second time period that is subsequent to the first time period, and phase 4 may occur during a third time period that is subsequent to the second time period. In some embodiments, the order of the time periods of phase 2 and phase 3 may be swapped such that the first time period during which phase 2 occurs is subsequent to the second time period during which phase 3 occurs. A non-periodic operation may select on a substantially random basis a sequence of phase 2 and phase 3 before a phase 4 (i.e., in one conversion cycle, a sequence of phases may be 0, 1, 2, 3, 4 and in another conversion cycle a sequence of phases may be 0, 1, 3, 2, 4). An example embodiment may operate with a periodic sequence of phases (0, 1, 2, 3, 4, 0, 1, 2, 3, 4, 0, 1, . . . ).

Switch 641p and switch 643p may be closed during phase 4, whereby the first observation and the second observation sampled on capacitor 623p and capacitor 633p during phase 2 and phase 3 may be combined by a charge-sharing operation; a combined value may be represented by a charge value at a node 603p. Due to the polarity of the first observation and the second observation being applied to the plus-side CDAC 601p being opposite, the combination by the charge-sharing operation may result in a combination of the positive component of the differential voltage of the first observation sampled on the capacitor 623p being combined with the negative component of the differential voltage of the second observation sampled on the capacitor 633p. A charge value at node 603p may further include a charge value sampled on a segment 605p of CDAC 601p at or near the end of phase 3. The charge value sampled on CDAC segment 605p may be a fixed value. In another embodiment, it may be a dither value.

Minus-side CDAC 601m may operate in a similar manner to plus-side CDAC 601p as described. Specifically, switch 641m and switch 643m may be closed during phase 4, whereby observations sampled on capacitor 623m and capacitor 633m during phase 2 and phase 3 may be combined by a charge-sharing operation and be represented by a charge value at a node 603m. Due to the polarity of the first observation and the second observation being applied to the minus-side CDAC 601m being opposite, the combination by the charge-sharing operation may result in a combination of the negative component of the differential voltage of the first observation sampled on the capacitor 623m being combined with the positive component of the differential voltage of the second observation sampled on the capacitor 633m. A charge at node 603m may further include a charge value sampled on a segment 605m of CDAC 601m at or near the end of phase 3. The charge value sampled on CDAC segment 605m may be a fixed value. In another embodiment, it may be a dither value.

PHOSITA recognize that a digital state machine 607, that may be referred to as a SAR (successive-approximation register), may be configured to provide a successive-approximation sequence of codes to successively reduce a range of uncertainty for a difference value observed by a comparing circuit 609. Comparing circuit 609 may guide SAR 607 in selecting individual codes in the successive-approximation sequence of codes. A resulting code provided by SAR 607 may be a digital value CODE2 representing a combination of the two observations. Specifically, CODE2 may represent a residue value VRES. A contribution from a potentially non-zero offset OS of a circuit configured to provide amplification may be substantially cancelled in CODE2, because a contribution from the first observation may be substantially equal-and-opposite to a contribution from the second observation. For example, having the polarities of the first observation and the second observation swapped with respect to the plus-side CDAC 601p and the minus-side CDAC 601m may result in the differential voltage of one of the observations being treated in the negative with respect to the other observation. For understanding, it can be viewed as having the positive component of the differential voltage of the first observation applied to the plus-side CDAC 601p and the negative component of the differential voltage of the first observation applied to the minus-side CDAC 601m results in the first observation being positive, for example A·(OS+VRES). Having the positive component of the differential voltage of the second observation applied to the minus-side CDAC 601m and the negative component of the differential voltage of the second observation applied to the plus-side CDAC 601p results in the second observation being negative, for example –(A·(OS–VRES)). The combination of the first observation and the second observation may result in the positive first observation and the negative second observation being added, resulting in a value with the offset OS being substantially cancelled out and amplified residue value A·VRES being substantially doubled. For example, the combination of the positive first observation and the negative second observation may result in a value of 2·A·VRES. Switches 611p (i.e., the switches located within the dotted rectangle 611p) and switches 611m (i.e., the switches located within the dotted rectangle 611m) may connect individual capacitors in CDAC 601p and CDAC 601m to a high reference potential VH or to a low reference potential VL responsive to a state of individual bits of each code in a successive-approximation sequence of codes. PHOSITA recognize that an operation of switches 611p may be complementary to an operation of switches 611m in a fully differential ADC2 630. A description herein of how CDAC 601p may operate shall be also an equivalent description of how CDAC 601m may operate.

Switches 611p driving capacitor 623p and capacitor 633p may be controlled by a single bit of each code in a successive-approximation sequence of codes. Accordingly, with respect to a successive-approximation sequence of codes, capacitor 623p and capacitor 633p may be switched as a single capacitor (C/4+C/4) that nominally is twice the size (capacitance) compared to that of a largest capacitor (C/4) in CDAC segment 605p. In one embodiment, nominal weight factors of individual bits in CDAC 601p that may be switched during a SAR ADC mode of operation may be binarily scaled (for example, having weight factors: ½, ¼, ⅛, ¹⁄₁₆, . . . ). In another embodiment, nominal weight factors of individual bits in a modified CDAC (not shown) may include redundancy (for example, having weight factors: ½, ¼, ⅛, ⅛, ¹⁄₁₆, ¹⁄₃₂, ¹⁄₆₄, ¹⁄₆₄, ¹⁄₁₂₈, . . . ). A resolution of ADC2 630 may be relatively low (such as 5 bits or less), medium, or relatively high (such as 10 bits or more).

PHOSITA recognize that ADC2 630 may be modified to incorporate any type of A/D conversion principle (including, but not limited to, SAR ADC, pipeline ADC, VCO-based ADC, flash ADC, cyclic ADC, interpolating ADC, hybrid ADC, . . . ). ADC2 630 may be configured to sample and convert a combination of a plurality of analog values. In some embodiments, ADCs that may be configured to sample and convert a combination of an analog input value and a dither value (i.e., a plurality of two analog values) may be implemented. The two analog values may be sampled on separate segments of a CDAC. ADC2 630 of FIG. 6 may be configured to sample and convert a combination of a first analog value (such as A·(OS+VRES)), a second analog value (such as A·(OS–VRES)), and a third analog value (such as a fixed or a dither value applied via the switches 611p and the switches 611m). Accordingly, ADC2 630 may be configured to sample and convert a combination of a plurality of three analog values. A plurality of analog values may be sampled on a plurality of segments of a CDAC 601p (e.g, capacitor 623p, capacitor 633p, and CDAC segment 605p). Each segment may comprise one or more capacitors, which may be switched individually or jointly during an A/D conversion mode of operation. A plurality of analog values may be sampled individually on separate segments of a CDAC at a plurality of nominally distinct sampling instants (e.g., at or near the end of phase 2 and at or near the end of phase 3). Individual segments of a CDAC configured to sample a plurality of analog values may be combined prior to or as a part of an analog-to-digital conversion operation (e.g., switch 641p and switch 643p may be closed in phase 4). Switch 643p, switch 643m, switch 635p, and switch 635m of FIG. 6 may be nominally redundant or superfluous, but they may be included to mitigate secondary artifacts such as switch charge injection familiar to PHOSITA. PHOSITA are also familiar with many types of circuits and methods for A/D converting an analog value represented as a charge quantity isolated on a node of a CDAC (e.g., node 603p), i.e., after it has been sampled as described herein. Accordingly, a further description of how to construct and operate comparing circuit 609, SAR circuit 607, and/or switches 611p and switches 611m need not be provided herein.

In another embodiment, ADC2 630 of FIG. 6 may be configured to provide an A/D conversion operation wherein switches 611p and switches 611m may connect capacitor 623p, capacitor 633p, capacitor 623m, and capacitor 633m to a set of predefined potentials (such as they may be all connected to VH) during phase 4, irrespective of any bit of any code in a successive-approximation sequence of codes provided by SAR 607. Accordingly, a CDAC segment 605p may be configured to sample a plurality of input values (such as A·(OS+VRES) and A·(OS-VRES)) on a plurality of segments of the CDAC (such as a first capacitor 623p and a second capacitor 633p) that are distinct from a segment of the CDAC (such as segment 605p) configured to apply a successive-approximation sequence of codes via switches (such as switches 611p) during an A/D conversion operation.

In another embodiment, switches 611p and switches 611m may not drive capacitor 623p, capacitor 633p, capacitor 623m, and capacitor 633m during phase 4 or at any time. Instead, during phase 4, the left-hand terminals of capacitor 623p, capacitor 633p, capacitor 623m, and capacitor 633m in FIG. 6 may be mutually shorted by 4 switches not shown in FIG. 6 (and they may be not connected to any fixed potential). An objective for nominally shorting and floating the 4 terminals during phase 4 may be to suppress a common-mode component of a first observation and a second observation (such as A·(OS+VRES) and A·(OS-VRES)). CDAC segment 605p and CDAC segment 605m may be switched according to a successive-approximation sequence of codes provided by SAR 607. CDAC segment 605p and CDAC segment 605m may be scaled relative to capacitor 623p, capacitor 623m, capacitor 633p, and capacitor 633m to provide a scaling of CODE2 relative to a reference voltage difference (VH-VL) and a full-scale input range of ADC2 630. For example, each capacitor in CDAC segment 605p and CDAC segment 605m may be reduced in size by a factor of 3 to compensate for a potential reduction of a full-scale input range by a factor of 3.

In yet another embodiment, a quantizer ADC2 may be configured to sample and combine more than two (such as 3, 4, 5, . . . ) observations and derive a digital value CODE2 to represent a weighted combination of the more-than-two observations. For example, capacitor 623p and capacitor 623m may be each split into two half-sized (C/8) capacitors and be configured with switches to sample analog values at 2 distinct points in time (such as at or near the end of a phase 2a, and at or near the end of a phase 2b). The quantizer ADC2 may be incorporated in a modified ADC circuit similar to ADC circuit 500 of FIG. 5. A control circuit may provide switch control signals to provide a modified sequence of phases of operation: (phase 0, phase 1, phase 2a, phase 3, phase 2b, phase 4). Phase 2 may be an OR combination of phase 2a and phase 2b. Specifically, switch 503p and 503m of AZ amplification circuit 520 in FIG. 5 may be closed in phase 2a as well as in in phase 2b. Accordingly, AZ amplification circuit 520 may be configured to provide a sequence of amplified analog residue values: A·(OS+VRES) during phase 2a; A·(OS-VRES) during phase 3; A·(OS+VRES) during phase 2b. The first value A·(OS+VRES) may be observed and sampled on a first half (C/8) of capacitor 623p and capacitor 623m during phase 2a. The second value A·(OS-VRES) may be observed and sampled on (C/4) capacitor 633p and capacitor 633m during phase 3. The third value A·(OS+VRES) may be observed and sampled on a second half (C/8) of capacitor 623p and capacitor 623m during phase 2b. A potentially non-zero offset of amplification circuit 521 may be substantially cancelled in CODE2, which may represent a weighted combination of the 3 sampled observations. Accordingly, the modified ADC circuit 500 comprising the quantizer ADC2 and operating with a modified sequence of phases may be configured to provide an auto-zeroing operation for a potentially non-zero offset of a circuit 521 configured to provide amplification. The modified ADC circuit 500 may provide an improved robustness to secondary artifacts such as charge injection and/or it may provide an improved suppression of low-frequency noise as compared to prior-art ADC circuits. ADC2 may be configured to observe and combine any number (two or greater) of amplified analog residue values. It may be configured to combine the plurality of observations with a nominally uniform or non-uniform weighting. An example embodiment described herein may be configured to apply a nominally non-uniform weighting: [+0.25; −0.50; +0.25]. A weighting factor (−0.50) may place substantially more weight (such as more than 20 percent more weight) than the other two weighting factors (+0.25; +0.25). The three weighting factors may represent nominal weighting of a first observed amplified analog residue value, a second observed amplified analog residue value, and a third observed amplified analog residue value. In another embodiment, a first weighting factor may be substantially equal to a second weighting factor (such as an absolute value of each of the two weighting factors may be within ±5%, e.g., [−0.48; +0.52]).

Figure 7A:
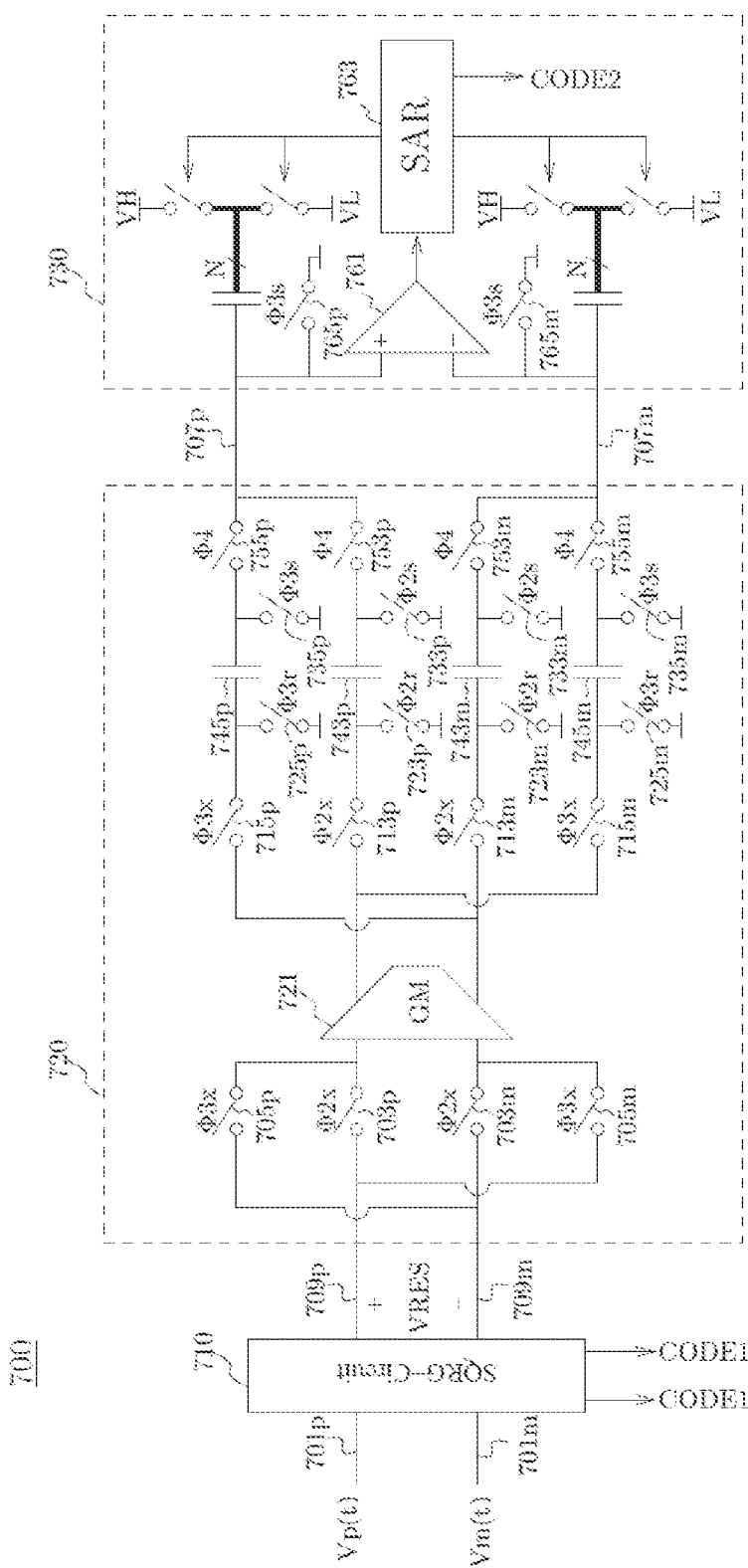
FIG. 7A shows another example embodiment of an ADC circuit according to various embodiments.

FIG. 7A shows another example embodiment of an ADC circuit 700 according to the present teaching. An ADC circuit 700 may be of a structure similar to ADC circuit 300 of FIG. 3. It may comprise a sampling-quantizing-residue-generating (SQRG) circuit 710 (compare to SQRG circuit 310, SQRG circuit 410, SQRG circuit 510 in FIG. 3, FIG. 4, and FIG. 5, respectively), an auto-zeroing residue amplifier circuit 720 (compare to residue amplifier circuit 320 and amplifier circuit 420 in FIG. 3 and FIG. 4, respectively), and a quantizer circuit ADC2 730 (compare to ADC2 330 and ADC2 430 in FIG. 3 and FIG. 4, respectively).

An amplified analog residue value may be a differential charge quantity provided via terminal 707p and terminal 707m. The amplified analog residue value may be derived in part by combining observations of two (or more) amplified analog residue values to provide an auto-zeroing operation. ADC2 730 may receive an analog value (e.g., a differential charge quantity) from AZ residue amplifier circuit 720 and perform an A/D conversion operation to provide a digital value CODE2, which may represent an analog residue value VRES that may be a voltage difference output by SQRG circuit 710 at terminal 709p and terminal 709m. Accordingly, an AZ residue amplifier circuit 720 may be configured to combine two (or more) observations as part of an auto-zeroing operation and to output a differential charge quantity (i.e., an analog value) to an ADC circuit 730.

Figure 7B:
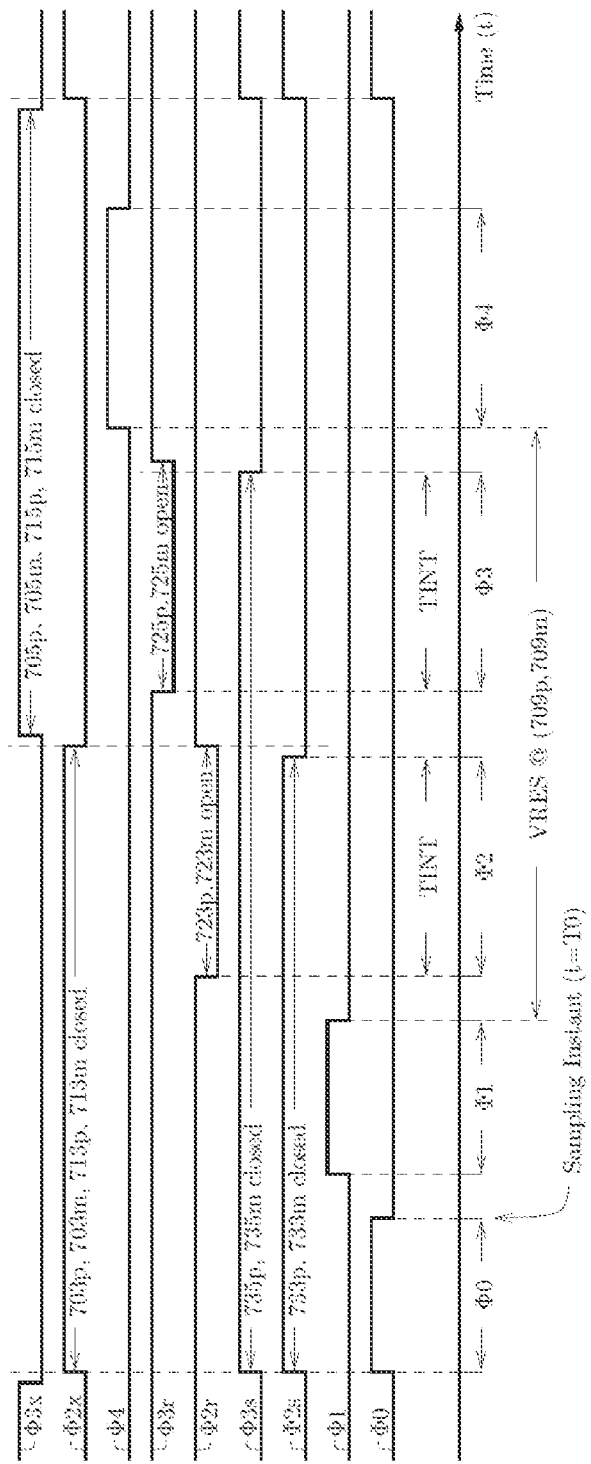
FIG. 7B shows an example timing diagram for the ADC circuit of FIG. 7A according to various embodiments.

FIG. 7B shows an example timing diagram for ADC circuit 700 of FIG. 7A. AZ residue amplifier circuit 720 may provide amplification by integrating for a predefined period TINT an analog value that may be derived from a residue value VRES received from an SQRG circuit 710. A first observation may be made during a phase 2 (labeled φ2 in FIG. 7B), wherein a transconductance circuit (GM circuit) 721 may receive a residue value VRES via switch 703p and switch 703m, and provide a differential output current GM· (VRES+OS). As illustrated, OS may be a potentially non-zero offset of a circuit 721 configured to provide amplification, and GM may be a factor of transconductance (i.e., a voltage-to-current gain factor). The differential output current may be integrated on capacitor 743p and capacitor 743m for a predefined period TINT to accumulate a differential charge quantity Q2=TINT·GM·(VRES+OS) on capacitor 743p and capacitor 743m. The differential charge quantity Q2 may be a first observation of an amplified analog residue value.

A second observation may be made during a phase 3 (labeled φ3 in FIG. 7B), wherein GM circuit 721 may receive a residue value VRES via switch 705p and switch 705m, and provide a differential output current via switch 715p and switch 715m. The residue value VRES of the second observation received by the GM circuit 721 may be of an opposite polarity to the residue value VRES of the first observation. In particular, the residue value VRES output by the SQRC circuit 710 may be a differential voltage. In phase 2 when the switch 703p and the switch 703m are closed, a positive component of the residue voltage of the first observation is provided to a first input of the GM circuit 721 and a negative component of the residue voltage of the first observation is provided to a second input of the GM circuit 721. In phase 2 when the switch 705p and the switch 705m are closed, a positive component of the residue voltage of the second observation is provided to the second input of the GM circuit 721 and a negative component of the residue voltage of the second observation is provided to the first input of the GM circuit 721, thereby being an opposite polarity of the residue voltage of the first observation provided to the GM circuit 721. Further, the polarities of the outputs of the GM circuit 721 may be of an opposite polarity for the first observation and the second observation. In particular, the switch 713p and the switch 713m being closed during phase 2 may cause a first output of the GM circuit 721 to be coupled to the capacitor 743p and a second output of the GM circuit 721 to be coupled to the capacitor 743m for the first observation. The switch 715p and the switch 715m being closed during phase 3 may cause the first output of the GM circuit 721 to be coupled to the capacitor 745m and the second output of the GM circuit 721 to be coupled to the capacitor 745p for the second observation. As the capacitor 743p and the capacitor 745p are utilized for producing a positive component when the observations are combined (as described further below) and the capacitor 743m and the capacitor 745m are utilized for producing a negative component when the observations are combined, the polarities of the GM circuit 721 may be of an opposite polarity with respect to the combination for the first observation and the second observation. The differential output current may be integrated on capacitor 745p and 745m for a predefined period TINT to accumulate a differential charge quantity Q3=TINT·GM·(VRES−OS) on capacitor 745p and capacitor 745m. The differential charge quantity Q3 may be a second observation of an amplified analog residue value.

The two (or more) observations may be combined at the beginning of a phase 4 (labeled φ4 in FIG. 7A and FIG. 7B) when switch 723p, switch 723m, switch 725p, switch 725m, switch 753p, switch 753m, switch 755p, and switch 755m may be closed. Charge-sharing operations may occur between capacitor 743p and capacitor 745p, and capacitor 743m and capacitor 745m, which combine the two (or more) observations (e.g., Q2 and Q3). The combined observations may be an amplified analog residue value represented by a charge quantity Q=Q2+Q3=2·TINT·GM·VRES available via terminal 707p and terminal 707m. Specifically, a zero voltage across terminal 707p and terminal 707m may indicate that a differential charge quantity Q=Q2+Q3 may have been transported via terminal 707p and terminal 707m during phase 4. ADC2 730 may be a SAR-type ADC comprising a comparing circuit 761. A SAR state machine 763 may be configured to derive a digital value CODE2 for which a voltage between terminal 707p and terminal 707m may be approximately zero (a degree of approximation may depend on a resolution of CODE2, ADC2 730).

The term "amplification" may be not limited to characterize signal processing for which an input value and an output value are of a same nature (such as voltage-in-voltage-out or current-in-current-out). For example, AZ residue amplifier circuit 720 may be a voltage-in-charge-out amplification circuit for which a factor of amplification A may be expressed in a unit such as coulomb-per-volt. A relatively larger factor of amplification A may indicate that a noise source within ADC2 730 may contribute relatively less to an overall noise level of ADC circuit 700 when it is referred to an input (e.g., terminal 701p and terminal 701m).

Switch 765p and switch 765m may apply a first predefined bias voltage to terminal 707p and terminal 707m while SAR state machine 763 may be configured with a predefined reset code (i.e., SAR state machine 763 may be in a predefined reset state) during phase 3. A second predefined bias voltage, which optionally may be the same as the first predefined bias voltage, may be applied via switch 733p, switch 733m, switch 735p, and switch 735m. A third predefined potential, which optionally may be the same as the first and/or second predefined bias voltages, may be applied via switch 723p, switch 723m, switch 725p, and switch 725m. The first predefined bias voltage, second predefined bias voltage, and third predefined bias voltage may be not labeled in FIG. 7A.

The example timing diagram in FIG. 7B shows that switch 723p, switch 723m, switch 725p, switch 725m, switch 733p, switch 733m, switch 735p, and switch 735m may be closed prior to phase 2, whereby capacitor 743p, capacitor 743m, capacitor 745p, and capacitor 745m may be reset to a predefined voltage and charge (for example, a nominally zero differential voltage and zero differential charge). Furthermore, prior to phase 2, switch 703p, switch 703m, switch 713p, and switch 713m may be closed, and a differential current GM·(OS+VRES) may flow via switch 713p, switch 723p, switch 713m, and switch 723m. Phase 2 may begin when switch 723p and switch 723m open and the differential current flows via capacitor 743p and capacitor 743m and switch 713p, switch 733p, switch 713m, and switch 733m. Phase 2 may end a predefined period TINT later when switch 733p and switch 733m open and effectively sample a differential charge Q2=TINT·GM·(OS+VRES) on capacitor 743p and capacitor 743m. Switch 723p and switch 723m may be closed a short delay (such as 200 ps) after opening switch 733p and switch 733m, for example to provide a path for current to flow via GM circuit 721. Switch 703p, switch 703m, switch 705p, switch 705m, switch 713p, switch 713m, switch 715p, and switch 715m may be toggled at substantially the same time in preparation for a second observation to be made during phase 3. Control signals (φ2x and φ3x) controlling switch 703p, switch 703m, switch 705p, switch 705m, switch 713p, switch 713m, switch 715p, and switch 715m may be non-overlapping in time, for example to avoid establishing a transient conductive path between terminal 709p and terminal 709m (compare to terminal 409p and terminal 409m in FIG. 4). A non-overlapping period may be short, such as 200 ps. PHOSITA are familiar with the use of non-overlapping control signals, and with implementing circuits to generate switch control signals, including non-overlapping switch control signals.

The example timing diagram of FIG. 7B shows that switch 725p, switch 725m, switch 735p, and switch 735m may be closed prior to a phase 3, whereby capacitor 745p and capacitor 745m may be reset to a predefined voltage and charge (for example, a nominally zero differential voltage and zero differential charge). Furthermore, prior to phase 3, switch 705p, switch 705m, switch 715p, and switch 715m may be closed, and a differential current GM·(VRES−OS) may flow via switch 715p, switch 725p, switch 715m, and switch 725m. Phase 3 may begin when switch 725p and switch 725m open, and the differential current flows via capacitor 745p and capacitor 745m and switch 715p, switch 735p, switch 715m, and switch 735m. Phase 3 may end a predefined period TINT later when switch 735p and switch 735m open and effectively sample a differential charge Q3=TINT·GM·(VRES−OS) on capacitor 745p and capacitor 745m. Switch 725p and switch 725m may be closed a short delay (such as 200 ps) after opening switch 735p and switch 735m, for example to provide a path for current from GM circuit 721 to flow. The residue voltage VRES may be not needed after completing phase 3, and SQRG circuit 710 may be reset at the beginning of phase 4.

A SAR ADC 730 may be configured to receive an amplified residue value Q=Q2+Q3 and to provide a digital value CODE2 to represent an analog residue value VRES by way of a successive-approximation charge-balancing operation provided during phase 4. A digital circuit (not shown) may be configured to receive and combine CODE1p, CODE1m, and CODE2 (and optionally also calibration information) to derive and output a code DOUT to represent an analog input value VIN=Vp(T0)−Vm(T0). A method for combining CODE1p, CODE1m, and CODE2 may include correcting for mismatch of CDAC capacitor ratios (e.g., digital correction) and/or any other known and/or useful technique.

Figure 7C:
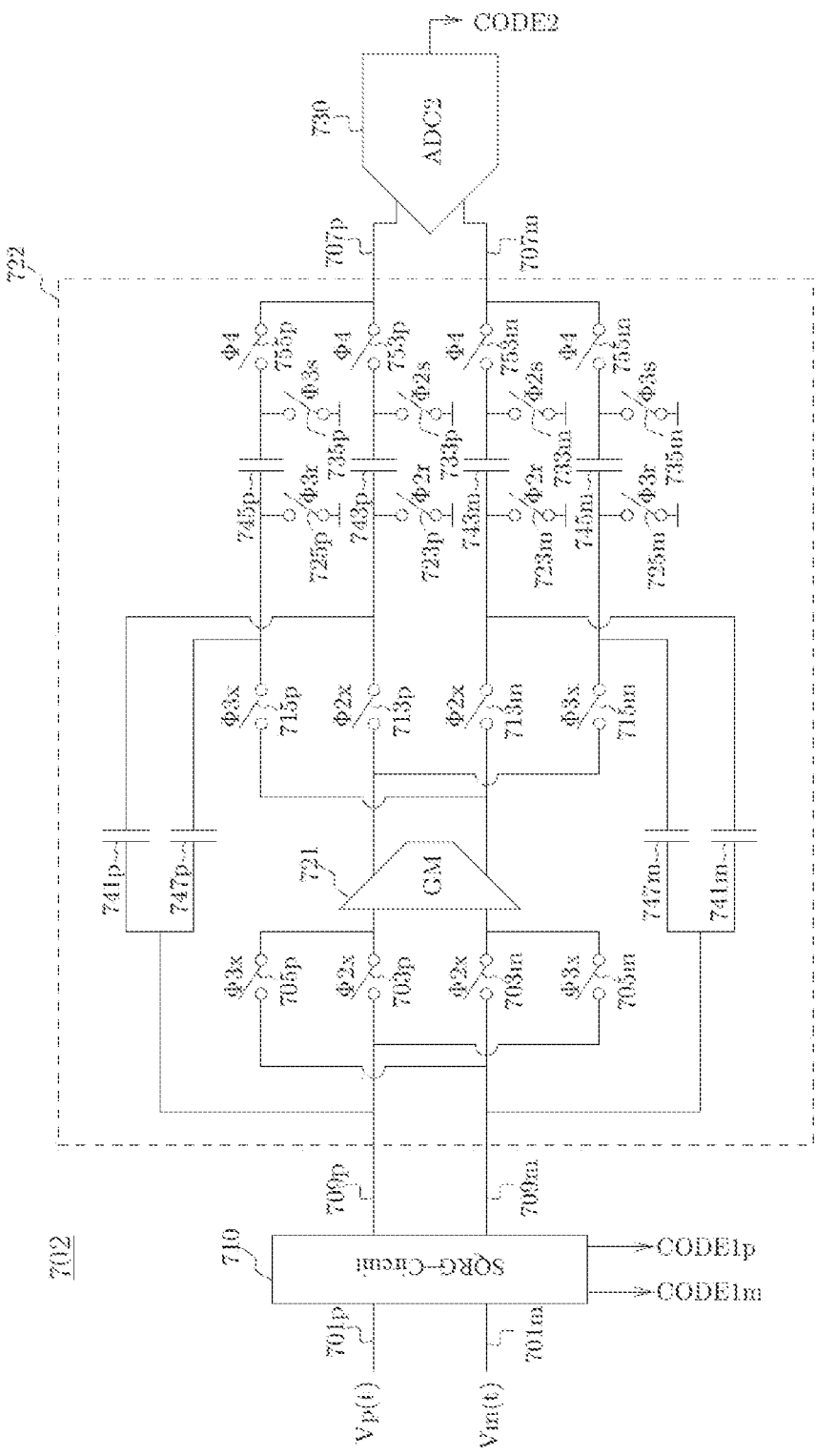
FIG. 7C shows an example ADC circuit comprising a modified AZ residue amplifier circuit according to various embodiments.

FIG. 7C shows an example ADC circuit 702 comprising a modified AZ residue amplifier circuit 722 compared to AZ residue amplifier circuit 720 of FIG. 7A. SQRG circuit 710 and ADC2 circuit 730 may be identical in ADC circuit 700 of FIG. 7A and ADC circuit 702 of FIG. 7C. More generally, equal reference numbers may correspond to identical parts in FIGS. 7A and 7C. The timing diagram of FIG. 7B may apply to either or both ADC circuit 700 and ADC circuit 702. AZ residue amplifier circuit 722 may be an extension of AZ residue amplifier circuit 720. Specifically, AZ residue amplifier circuit 722 may have 4 capacitors (capacitor 741p, capacitor 741m, capacitor 747p, and capacitor 747m) added to AZ residue amplifier circuit 720. Capacitor 741p and capacitor 741m may be configured to provide negative feedback for GM circuit 721 when switch 703p, switch 703m, switch 713p, and switch 713m are closed (φ2x=1). Capacitor 747p and capacitor 747m may be configured to provide negative feedback for GM circuit 721 when switch 705p, switch 705m, switch 715p, and switch 715m are closed (φ3x=1). A duration TINT of phase 2 and phase 3 (see FIG. 7B) may be sufficiently long to allow GM circuit 721 to substantially settle to an asymptotic output voltage and a nominally zero input voltage (which PHOSITA will recognize as a "virtual short"). Various imperfections of GM circuit 721 may cause the virtual-short input voltage to be non-zero. Such imperfections may include a potentially non-zero offset OS.

AZ residue amplifier circuit 722 may be configured to operate as a charge-in-charge-out AZ residue amplification circuit. Charge may be transported via terminal 709p and terminal 709m and negative-feedback capacitor 741p, capacitor 741m, capacitor 747p, and capacitor 747m when GM circuit 721 settles towards an asymptotic state in phase 2 and/or phase 3. An output impedance of SQRG circuit 710 may be capacitive (see FIG. 4; SQRG circuit 710 may be implemented as SQRG circuit 410). SQRG circuit 710 may provide an analog residue value that may be represented as a charge quantity QRES=VRES·C, where C may be a capacitance (e.g., an output impedance) characterizing SQRG circuit 710. A zero voltage across terminal 709p and terminal 709m may indicate that a charge quantity QRES representing an analog residue value has been transported via terminal 709p and terminal 709m since a sampling instant (t=T0). AZ residue amplification circuit 722 may amplify QRES during phase 2 and store a first observation of an amplified residue value as a charge Q2=A·(VRES+OS)·C=A·(QRES+OS·C) on capacitor 743p and capacitor 743m. AZ amplifier circuit 722 may further amplify QRES during phase 3 and store a second observation of an amplified residue value as a charge Q3=A·(VRES−OS)·C=A·(QRES−OS·C) on capacitor 745p and capacitor 745m. The two observations may be combined by a charge-sharing operation Q=Q2+Q3=2A·QRES at the beginning of phase 4 (as described for AZ amplifier circuit 720).

In a phase 2, switch 725p and switch 725m may be closed and switch 723p and switch 723m may be open. GM circuit 721 may then settle towards an asymptotic state by transporting charge (nominally QRES) via terminal 709p and terminal 709m, and capacitor 741p and capacitor 741m, to establish a virtual-short voltage (e.g., OS nominally zero) at its input. The transported charge may be returned (transported back) via terminal 709p and terminal 709m and capacitor 741p and capacitor 741m when switch 725p and switch 725m may be closed shortly after phase 2 (see timing diagram in FIG. 7B). Subsequently, in phase 3, switch 725p and switch 725m may be open and switch 723p and switch 723m may be closed. GM circuit 721 may then settle towards an asymptotic state by transporting charge (nominally QRES) via terminal 709p and terminal 709m, and capacitor 747p and capacitor 747m, to establish a virtual-short voltage at its input.

A first amplification factor for an operation of AZ amplification circuit 722 during phase 2 may be substantially a function of a ratio of capacitance of capacitor 743p and capacitor 743m, and capacitor 741p and capacitor 741m. A second amplification factor for an operation of AZ amplification circuit 722 during phase 3 may be substantially a function of a ratio of capacitance of capacitor 745p and capacitor 745m, and capacitor 747p and capacitor 747m. The first and second amplification factors may be nominally identical. Capacitor 743p, capacitor 743m, capacitor 745p, and capacitor 745m may be nominally identical. Capacitor 741p, capacitor 741m, capacitor 747p, and capacitor 747m may be nominally identical.

To compare, an amplification factor for AZ amplifier circuit 720 (FIG. 7A) may be a combination of a time period (TINT), a transconductance (GM) and a capacitance. In one comparison, an amplification factor for AZ residue amplifier circuit 722 may be relatively less sensitive to a variability of a manufacturing process than AZ residue amplifier circuit 720 may be. In another comparison, AZ residue amplifier circuit 720 may be relatively less sensitive to noise from GM circuit 721 than AZ amplifier circuit 722 may be. A preference for AZ residue amplifier circuit 720 over AZ residue amplifier circuit 722 (or vice versa) may depend on one or more design objectives. In another embodiment, ADC circuit 702 of FIG. 7C may be configured to not settle fully during phase 2 and phase 3. For example, a predefined period TINT shown in the timing diagram of FIG. 7B may be relatively short compared to a time period needed for AZ amplification circuit 722 to settle substantially fully. For example, AZ residue amplification circuit 722 may be configured to settle to a predefined fraction (such as 63 percent, 86 percent, 95 percent, 98 percent, or . . . ) of an asymptotic value.

An operation of AZ amplifier 722 may be not significantly dependent on capacitor 741p, capacitor 741m, capacitor 743p, capacitor 743m, capacitor 745p, capacitor 745m, capacitor 747p, and capacitor 747m being linear (a linear capacitor may provide a linear relationship between a voltage and a charge). In some embodiments, capacitor 741p, capacitor 741m, capacitor 743p, capacitor 743m, capacitor 745p, capacitor 745m, capacitor 747p, and capacitor 747m may be implemented using somewhat-nonlinear MOS capacitors, i.e., MOS (metal-oxide-semiconductor) semiconductor devices biased to provide a relatively constant (such as within ±10%) capacitance for a voltage range used in operation. MOS capacitors may be relatively smaller and less costly than MOM (Metal-Oxide-Metal) capacitors, which may be relatively more linear. Any insulating-barrier structure, including many semiconductor devices, configured to store charge may be used for implementing capacitor 741p, capacitor 741m, capacitor 743p, capacitor 743m, capacitor 745p, capacitor 745m, capacitor 747p, and/or capacitor 747m. PHOSITA will recognize that a MOS semiconductor need not be constructed with a metal gate terminal, and that the common term/acronym "MOS" (metal-oxide-semiconductor) should not be construed as limiting for materials used to fabricate semiconductor devices. The term "MOS semiconductor device" shall include a wide range of semiconductor devices comprising a nominally non-conductive barrier (which may be, but need not be, made from oxide). Any capacitor or other circuit component described in this teaching may be at least slightly nonlinear. Substantial capacitor nonlinearity may largely cancel for a charge-in-charge-out operation of AZ amplifier circuit 722 if common-mode voltages at node 709p, terminal 709m, node 707p, and terminal 707m are made to be substantially equal (such as within ±50 mV). In other words, a charge-in-charge-out operation of AZ amplifier circuit 722 may be substantially linear even if capacitor 741p, capacitor 741m, capacitor 743p, capacitor 743m, capacitor 745p, capacitor 745m, capacitor 747p, and capacitor 747m are relatively less linear. Common-mode voltages may be a function of a bias voltage applied via switch 733p, switch 733m, switch 735p, and switch 735m (FIG. 7C) and a bias voltage applied via switch 405p and switch 405m (FIG. 4) in SQRG circuit 710, which may be implemented as SQRG circuit 410 of FIG. 4.

Figure 7D:
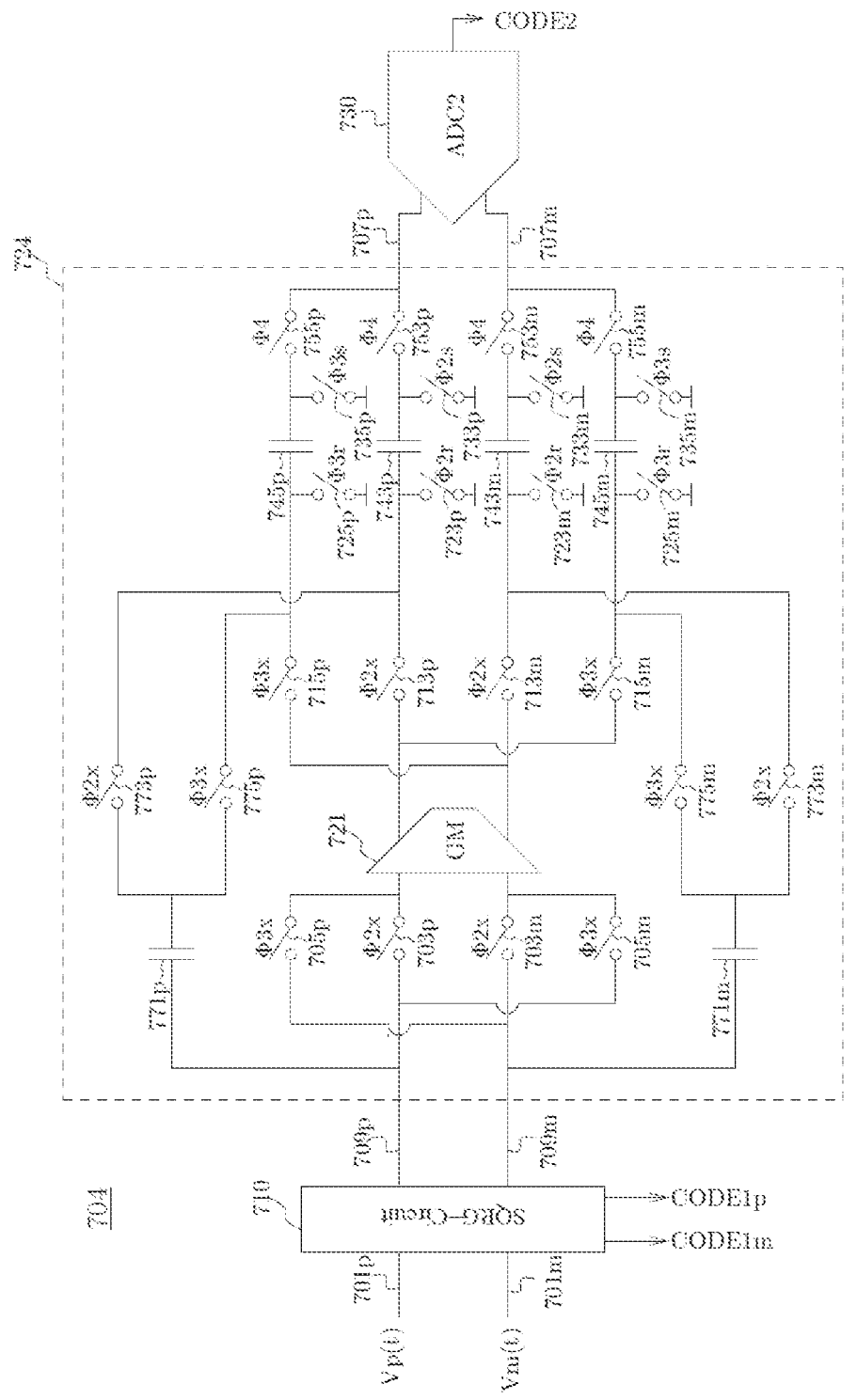
FIG. 7D shows yet another example embodiment of an ADC circuit, including a modified AZ residue amplification circuit, according to various embodiments.

FIG. 7D shows yet another example embodiment of an ADC circuit 704, including a modified AZ residue amplification circuit 724. Compared to AZ residue amplification circuit 722 of FIG. 7C, 4 capacitors (capacitor 741p, capacitor 741m, capacitor 747p, capacitor 747m) of FIG. 7C may be substituted by two capacitors (capacitor 771p and capacitor 771) and four switches (switch 773p, switch 773m, switch 775p, and switch 775m). A benefit of AZ residue amplification circuit 724 compared to AZ residue amplification circuit 722 may be a reduced sensitivity to noise from GM circuit 721.

AZ circuit 724 of FIG. 7D may be further modified (in part) by substituting GM circuit 721 by a voltage-in-voltage-out circuit configured to provide amplification. An example voltage-in-voltage-out amplification circuit may be a two-stage amplifier circuit incorporating a well-known Miller-type of frequency compensation. Other embodiments may incorporate other types of circuits configured to provide amplification.

Example Implementations

The following examples are provided by way of illustration.

Example 1 may include an analog-to-digital converter (ADC) circuit for receiving an analog input value and providing a digital output code to represent the analog input value, the ADC circuit comprising a sampling-quantizing-residue-generating (SQRG) circuit configured to receive the analog input value and to provide a first digital code derived at least in part from the analog input value; the SQRG circuit further configured to provide an analog residue value derived at least in part from the analog input value and the first code, an auto-zeroing residue amplification circuit configured to receive and amplify the analog residue value and to provide a first and a second observation of the amplified analog residue value, a quantizer circuit configured to derive a second code to represent a combination of at least the first and second observations of the amplified analog residue value, and a digital circuit configured to combine at least the first code and the second code to derive the digital output code.

Example 2 may include the ADC circuit of example 1 wherein the first code is derived at least in part from a combination of the analog input value and a dither value.

Example 3 may include the ADC circuit of example 1 wherein the auto-zeroing residue amplification circuit comprises an active circuit configured to provide amplification, the active circuit configured to receive the analog residue value in a first polarity to provide the first observation of the amplified analog residue value, the active circuit further configured to receive the analog residue value in a second polarity opposite the first polarity to provide the second observation of the amplified analog residue value.

Example 4 may include the ADC circuit of example 1 wherein the auto-zeroing residue amplification circuit comprises an active circuit having a potentially non-zero offset that contributes to the first and second observations of the amplified analog residue value, and wherein a combination of the first and second observations of the amplified analog residue value substantially cancels a contribution from the offset to the second code.

Example 5 may include the ADC circuit of example 1 wherein the auto-zeroing amplification circuit is further configured to provide a third observation of the amplified analog reside value, and wherein the second code provided by the quantizer circuit represents a weighted combination of the first, second, and third observations of the amplified residue value.

Example 6 may include the ADC circuit of example 5 wherein the weighted combination places substantially more weight on at least one of the three observations of the amplified residue value.

Example 7 may include the ADC circuit of example 1 wherein the second code provided by the quantizer circuit is a weighted combination of the first and second observations of the amplified residue value, and where an absolute value of a first weighting factor for the first observation of the amplified residue value is substantially the same as a second weighting factor for the second observation of the amplified residue value.

Example 8 may include the ADC circuit of example 1 wherein the quantizer circuit derives a third code to represent the first observation of the amplified analog residue value and further derives a fourth code to represent the second observation of the amplified analog residue value, and wherein the second code is derived at least in part by combining the third code and the fourth code.

Example 9 may include the ADC circuit of example 1 wherein the first and the second observations of the amplified analog residue value are represented individually by a first and a second analog value that are combined to provide a combined analog value.

Example 10 may include the ADC circuit of example 9 wherein the first and the second analog values are combined by a charge-sharing operation.

Example 11 may include the ADC circuit of example 1 wherein the quantizer circuit comprises a CDAC circuit configured to sample the first observation of the amplified residue value on a first segment of the CDAC circuit and further configured to sample the second observation of the amplified residue value on a second segment of the CDAC circuit.

Example 12 may include the ADC circuit of example 11 wherein the first and the second segments of the CDAC circuit are used for digital-to-analog converting a plurality of codes in a successive-approximation sequence of codes.

Example 13 may include the ADC circuit of example 1 wherein the quantizer circuit comprises a successive-approximation-register (SAR) state machine.

Example 14 may include the ADC circuit of example 1 wherein the analog residue value is a charge quantity provided as an input to the auto-zeroing residue amplification circuit.

Example 15 may include the ADC circuit of example 14 wherein the quantizer circuit is configured to receive a charge quantity representing a combination of the first and second observations of the amplified analog residue value.

Example 16 may include the ADC circuit of example 15 wherein a semiconductor device is configured for storing a charge quantity representing one of the two observations of the amplified residue value.

Example 17 may include the ADC circuit of example 1 wherein a resolution of the first code is at least 10 bits.

Example 18 may include the ADC circuit of example 1 wherein the auto-zeroing residue amplification circuit is configured to provide amplification by substantially integrating for a predefined period an analog quantity derived from the analog residue value.

Example 19 may include the ADC circuit of example 1 wherein the auto-zeroing residue amplification circuit is configured to provide amplification by settling to a predefined fraction of an asymptotic value, and wherein the predefined fraction is at most 98 percent.

Example 20 may include the ADC circuit of example 1 wherein the SQRG circuit is configured to derive the first code in part by deriving a residue with respect to a code having a resolution that is at least 3 bits less than a resolution of the first code.

Example 21 may include an analog-to-digital converter (ADC) circuit, comprising a sampling-quantizing-residue-generating (SQRG) circuit to produce a first digital code based at least in part on an analog input value received by the ADC circuit, and produce an analog residue value based at least in part on the first digital code and the analog input value, an auto-zeroing residue amplification circuit to amplify the analog residue value, produce a first observation of the amplified analog residue value, and produce a second observation of the amplified analog residue value, a quantizer circuit to produce a second digital code, the second digital code representative of a combination of at least the first observation and the second observation, and a digital circuit to produce a digital output code, the digital output code to represent the analog input value, wherein the first digital code and the second digital code are combined to produce the digital output code.

Example 22 may the ADC circuit of example 21, wherein the auto-zeroing residue amplification circuit comprises an amplification circuit to provide amplification, wherein, to produce the first observation of the amplified analog residue value, the amplification circuit is to receive the analog residue value in a first polarity, and wherein, to produce the second observation of the amplified analog residue value, the amplification circuit is to receive the analog residue value in a second polarity, the second polarity being opposite the first polarity.

Example 23 may include the ADC circuit of example 22, wherein the auto-zeroing residue amplification circuit includes a first switch and a second switch to be closed during a phase to cause a polarity of the analog residue value to be swapped.

Example 24 may include the ADC circuit of example 22, wherein a polarity of the analog residue value is swapped prior to amplification to produce the second observation.

Example 25 may include the ADC circuit of example 21, wherein the second digital code comprises a weighted combination of the first observation and the second observation, and wherein an absolute value of a first weighting factor for the first observation is substantially equal to an absolute value of a second weighting factor for the second observation.

Example 26 may include the ADC circuit of example 21, wherein the quantizer circuit is to combine the first observation and the second observation to produce the combination of at least the first observation and the second observation, and wherein to combine the first observation and the second observation is to cause an offset to be substantially cancelled.

Example 27 may include the ADC circuit of example 26, wherein the auto-zeroing residue amplification circuit includes an active circuit, wherein the offset is caused by the active circuit, and wherein the offset contributes to the first observation and the second observation.

Example 28 may include the ADC circuit of example 21, wherein the first digital code is produced based at least in part on the analog input value and a dither value.

Example 29 may include the ADC circuit of example 21, wherein the auto-zeroing amplification circuit is further to produce a third observation of the amplified analog residue value, and wherein the combination of at least the first observation and the second observation comprises a weighted combination of the first observation, the second observation, and the third observation.

Example 30 may include the ADC circuit of example 21, wherein the first observation is represented by a first analog value, wherein the second observation is represented by a second analog value, and wherein the first analog value and the second analog value are to be combined to produce a combined analog value, the combined analog value to be utilized to produce the second digital code.

Example 31 may include the ADC circuit of example 30, wherein a charge-sharing operation is to be utilized to combing the first analog value and the second analog value.

Example 32 may include the ADC circuit of example 21, wherein the analog residue value is conveyed as a charge quantity as an input to the auto-zeroing residue amplification circuit.

Example 33 may include the ADC circuit of example 32, wherein the charge quantity is a first charge quantity, and wherein the quantizer circuit is to receive a second charge quantity that represents the combination of at least the first observation and the second observation.

Example 34 may include the ADC circuit of example 33, wherein a semiconductor device is utilized for storage of the second charge quantity.

Example 35 may include the ADC circuit of example 24, wherein a polarity of the amplified analog residue value is swapped after amplification to produce the second observation.

Example 36 may include an auto-zeroing residue amplification circuit for cancellation of an offset, the auto-zeroing residue amplification circuit comprising an amplification circuit to amplify a first observation of an analog residue value received by the auto-zeroing residue amplification circuit and a second observation of the analog residue value, the analog residue value being a residue of a digital code produced from analog-to-digital conversion of an analog input value, wherein the amplified first observation and the amplified second observation are to be utilized with the digital code to produce a digital output code that represents the analog input value, and one or more switches coupled between the amplification circuit and an input of the auto-zeroing residue amplification circuit, the analog residue value received via the input of the auto-zeroing residue amplification circuit, wherein the one or more switches are to selectively apply the first observation and the second observation to the amplification circuit.

Example 37 may include the auto-zeroing residue amplification circuit of example 36 wherein the second group of one or more switches are to apply the first observation to the second capacitor and the third capacitor during the first phase, and wherein the second group of one or more switches are to apply the second observation to the first capacitor and the fourth capacitor during the second phase.

Example 38 may include the auto-zeroing residue amplification circuit of example 37, wherein the one or more switches comprise a first group of one or more switches, wherein the auto-zeroing residue amplification circuit further comprises a first capacitor and a second capacitor to store first charges and to combine the first charges, a third capacitor and a fourth capacitor to store second charges and to combine the second charges, and a second group of one or more switches coupled between the amplification circuit and the first capacitor, the second capacitor, the third capacitor, and the fourth capacitor, the second group of one or more switches to selectively apply the first observation and the second observation to the first capacitor, the second capacitor, the third capacitor, and the fourth capacitor, the first observation and the second observation to form the first charges on the first capacitor and the second capacitor and the second charges on the third capacitor and the fourth capacitor.

Example 39 may include the auto-zeroing residue amplification circuit of example 38, wherein the second group of one or more switches are to apply the first observation to the second capacitor and the third capacitor in a first output polarity during the first phase, wherein the second group of one or more switches are to apply the second observation to the first capacitor and the fourth capacitor in a second output polarity during the second phase, and wherein the second output polarity is opposite from the first output polarity.

Example 40 may include the auto-zeroing residue amplification circuit of example 38, further comprising a third group of one or more switches coupled between the first capacitor, the second capacitor, the third capacitor, and the fourth capacitor and an output of the auto-zeroing residue amplification circuit, wherein the third group of one or more switches are to cause the first charges of the first capacitor and the second capacitor to be combined during a third phase, wherein the third group of one or more switches are to cause the second charges of the third capacitor and the fourth capacitor to be combined during the third phase, and wherein the third phase is separate from the first phase and the second phase.

Example 41 may include the auto-zeroing residue amplification circuit of example 36, further comprising one or more capacitors coupled between input of the amplification circuit and output of the amplification circuit, the one or more capacitors to provide feedback for the auto-zeroing residue amplification circuit.

The foregoing outlines features of one or more embodiments of the subject matter disclosed herein. These embodiments are provided to enable a person having ordinary skill in the art (PHOSITA) to better understand various aspects of the present disclosure. Certain well-understood terms, as well as underlying technologies and/or standards may be referenced without being described in detail. It is anticipated that the PHOSITA will possess or have access to background knowledge or information in those technologies and standards sufficient to practice the teachings of the present disclosure.

The PHOSITA will appreciate that they may readily use the present disclosure as a basis for designing or modifying other processes, structures, or variations for carrying out the same purposes and/or achieving the same advantages of the embodiments introduced herein. The PHOSITA will also recognize that such equivalent constructions do not depart from the spirit and scope of the present disclosure, and that they may make various changes, substitutions, and alterations herein without departing from the spirit and scope of the present disclosure.

Note that the activities discussed above with reference to the FIGURES are applicable to any integrated circuit that involves signal processing (for example, gesture signal processing, video signal processing, audio signal processing, analog-to-digital conversion, digital-to-analog conversion), particularly those that can execute specialized software programs or algorithms, some of which may be associated with processing digitized real-time data. Certain embodiments can relate to multi-DSP, multi-ASIC, or multi-SoC signal processing, floating point processing, signal/control processing, fixed-function processing, microcontroller applications, etc. In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems. Moreover, certain embodiments discussed above can be provisioned in digital signal processing technologies for medical imaging, patient monitoring, medical instrumentation, and home healthcare. This could include, for example, pulmonary monitors, accelerometers, heart rate monitors, or pacemakers, along with peripherals therefor. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion, rendering, and display products in battery monitoring, control systems, reporting controls, maintenance activities, and others. In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The particular embodiments of the present disclosure may readily include a system on chip (SoC) central processing unit (CPU) package. An SoC represents an integrated circuit (IC) that integrates components of a computer or other electronic system into a single chip. It may contain digital, analog, mixed-signal, and radio frequency functions: all of which may be provided on a single chip substrate. Other embodiments may include a multi-chip-module (MCM), with a plurality of chips located within a single electronic package and configured to interact closely with each other through the electronic package. Any module, function, or block element of an ASIC or SoC can be provided, where appropriate, in a reusable "black box" intellectual property (IP) block, which can be distributed separately without disclosing the logical details of the IP block. In various other embodiments, the digital signal processing functionalities may be implemented in one or more silicon cores in application-specific integrated circuits (ASICs), field-programmable gate arrays (FPGAs), and other semiconductor chips.

In some cases, the teachings of the present disclosure may be encoded into one or more tangible, non-transitory computer-readable mediums having stored thereon executable instructions that, when executed, instruct a programmable device (such as a processor or DSP) to perform the methods or functions disclosed herein. In cases where the teachings herein are embodied at least partly in a hardware device (such as an ASIC, IP block, or SoC), a non-transitory medium could include a hardware device hardware-programmed with logic to perform the methods or functions disclosed herein. The teachings could also be practiced in the form of Register Transfer Level (RTL) or other hardware description language such as VHDL or Verilog, which can be used to program a fabrication process to produce the hardware elements disclosed.

In example implementations, at least some portions of the processing activities outlined herein may also be implemented in software. In some embodiments, one or more of these features may be implemented in hardware provided external to the elements of the disclosed figures, or consolidated in any appropriate manner to achieve the intended functionality. The various components may include software (or reciprocating software) that can coordinate in order to achieve the operations as outlined herein. In still other embodiments, these elements may include any suitable algorithms, hardware, software, components, modules, interfaces, or objects that facilitate the operations thereof.

Additionally, some of the components associated with described microprocessors may be removed, or otherwise consolidated. In a general sense, the arrangements depicted in the figures may be more logical in their representations, whereas a physical architecture may include various permutations, combinations, and/or hybrids of these elements. It is imperative to note that countless possible design configurations can be used to achieve the operational objectives outlined herein. Accordingly, the associated infrastructure has a myriad of substitute arrangements, design choices, device possibilities, hardware configurations, software implementations, equipment options, etc.

Any suitably-configured processor component can execute any type of instructions associated with the data to achieve the operations detailed herein. Any processor disclosed herein could transform an element or an article (for example, data) from one state or thing to another state or thing. In another example, some activities outlined herein may be implemented with fixed logic or programmable logic (for example, software and/or computer instructions executed by a processor) and the elements identified herein could be some type of a programmable processor, programmable digital logic (for example, an FPGA, an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof. In operation, processors may store information in any suitable type of non-transitory storage medium (for example, random access memory (RAM), read only memory (ROM), FPGA, EPROM, electrically erasable programmable ROM (EEPROM), etc.), software, hardware, or in any other suitable component, device, element, or object where appropriate and based on particular needs. Further, the information being tracked, sent, received, or stored in a processor could be provided in any database, register, table, cache, queue, control list, or storage structure, based on particular needs and implementations, all of which could be referenced in any suitable timeframe. Any of the memory items discussed herein should be construed as being encompassed within the broad term 'memory.' Similarly, any of the potential processing elements, modules, and machines described herein should be construed as being encompassed within the broad term 'microprocessor' or 'processor.' Furthermore, in various embodiments, the processors, memories, network cards, buses, storage devices, related peripherals, and other hardware elements described herein may be realized by a processor, memory, and other related devices configured by software or firmware to emulate or virtualize the functions of those hardware elements.

Computer program logic implementing all or part of the functionality described herein is embodied in various forms, including, but in no way limited to, a source code form, a computer executable form, a hardware description form, and various intermediate forms (for example, mask works, or forms generated by an assembler, compiler, linker, or locator). In an example, source code includes a series of computer program instructions implemented in various programming languages, such as an object code, an assembly language, or a high-level language such as OpenCL, RTL, Verilog, VHDL, Fortran, C, C++, JAVA, or HTML for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

In the discussions of the embodiments above, the capacitors, buffers, graphics elements, interconnect boards, clocks, DDRs, camera sensors, converters, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, non-transitory software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In another example embodiment, the electrical circuits of the FIGURES may be implemented as standalone modules (e.g., a device with associated components and circuitry configured to perform a specific application or function) or implemented as plug-in modules into application-specific hardware of electronic devices.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this disclosure. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke 35 U.S.C. § 112(f) as it exists on the date of the filing hereof unless the words "means for" or "steps for" are specifically used in the particular claims; and (b) does not intend, by any statement in the disclosure, to limit this disclosure in any way that is not otherwise reflected in the appended claims.

What is claimed is:

1. A circuit, comprising:
    an analog-to-digital converter (ADC) to receive an analog input value;
    a digital-to-analog converter (DAC) coupled to an output of the ADC;
    subtractor circuitry to produce a positive component of a residue value and a negative component of the residue value at a positive terminal and a negative terminal respectively, the residue value being a difference between the analog input value and the output of the DAC;
    a first switch and a second switch coupled to the positive terminal and the negative terminal respectively, the first switch and the second switch being open during a first phase and closed during a second phase;
    a third switch and a fourth switch coupled to the negative terminal and the positive terminal respectively, the third switch and the fourth switch are closed during the first phase and open during the second phase; and
    an active circuit having a positive terminal coupled to the first switch and the third switch and a negative terminal coupled to the second switch and the fourth switch.

2. The circuit of claim 1, further comprising:
    a further ADC coupled to an output of the active circuit.

3. The circuit of claim 2, wherein the further ADC is to make a first observation of the output of the active circuit during the first phase, and make a second observation of the output of the active circuit during the second phase.

4. The circuit of claim 2, further comprising:
    a digital circuit to receive a first digital code based on a first observation of the output of the active circuit made during the first phase and to receive a second digital code based on a second observation of the output of the active circuit made during the second phase.

5. The circuit of claim 4, wherein the digital circuit is to receive a further digital code from the further ADC.

6. The circuit of claim 4, wherein the digital circuit is to output a final digital code representative of the analog input value.

7. The circuit of claim 2, wherein the further ADC comprises a first quantizer and a second quantizer, the first quantizer is to make a first observation of the output of the active circuit during the first phase, and the second quantizer is to make a second observation of the output of the active circuit during the second phase.

8. A circuit, comprising:
    a positive terminal to receive a positive component of a residue value, the residue value being a difference between an analog input value and a digital code generated from the analog input value;
    a negative terminal to receive a negative component of the residue value;
    a first switch and a second switch coupled to the positive terminal and the negative terminal respectively, the first switch and the second switch being open during a first phase and closed during a second phase;
    a third switch and a fourth switch coupled to the negative terminal and the positive terminal respectively, the third switch and the fourth switch are closed during the first phase and open during the second phase; and
    an active circuit having a positive input terminal coupled to the first switch and the third switch and a negative input terminal coupled to the second switch and the fourth switch.

9. The circuit of claim 8, further comprising:
    a first capacitor couplable to a positive output terminal of the active circuit during the first phase;
    a second capacitor couplable to a negative output terminal of the active circuit during the first phase;

a third capacitor couplable to the negative output terminal of the active circuit during the second phase; and a fourth capacitor couplable to the positive output terminal of the active circuit during the second phase.

10. The circuit of claim 9, further comprising:

first switch to couple the first capacitor to a positive input node of a comparing circuit during a fourth phase;

comparing switch to couple the second capacitor to a negative input node of the comparator circuit during the fourth phase;

third switch to couple the third capacitor to the positive input node of the comparing circuit during the fourth phase; and fourth switch to couple the fourth capacitor to the negative input node of the comparing circuit during the fourth phase.

11. The circuit of claim 10, further comprising:

a first capacitive digital-to-analog converter segment coupled to the positive input node of the comparing circuit; and a second capacitive digital-to-analog converter segment coupled to the negative input node of the comparing circuit.

12. The circuit of claim 10, further comprising:

a digital state machine coupled to an output of the comparing circuit.

13. The circuit of claim 8, further comprising:

a first capacitive digital-to-analog converter segment couplable to an output of the active circuit during the first phase; and a second capacitive digital-to-analog converter segment couplable to the output of the active circuit during the second phase, but in opposite polarity relative to the first phase.

14. The circuit of claim 8, further comprising:

a third capacitive digital-to-analog converter segment couplable to sample a dither value.

15. The circuit of claim 9, switches to short one side of the first capacitor, the second capacitor, and the third capacitor, and the fourth capacitor together.

16. The circuit of claim 8, further comprising:

a first capacitive digital-to-analog converter segment couplable to sample a first analog value;

a second capacitive digital-to-analog converter segment couplable to sample a second analog value; and a third capacitive digital-to-analog converter segment couplable to sample a third analog value.

17. A circuit, comprising:

a positive input terminal to receive a positive component of a residue value, the residue value being a difference between an analog input value and a digital code generated from the analog input value;

a negative input terminal to receive a negative component of the residue value;

a first switch and a second switch coupled to the positive terminal and the negative terminal respectively, operable to conduct the residue value having a first polarity during a first phase;

a third switch and a fourth switch coupled to the negative terminal and the positive terminal respectively, operable to conduct the residue value having a second polarity during a second phase, the second polarity being opposite of the first polarity;

a transconductance circuit coupled to receive the residue value during the first phase and the second phase;

first and second capacitors to integrate the residue value having the first polarity during the first phase;

third and fourth capacitors to integrate the residue value having the second polarity during the second phase;

switches operable to short one plate of the first and third capacitors together at a positive output terminal during a third phase; and switches operable to short one plate of the second and fourth capacitors together at a negative output terminal during the third phase.

18. The circuit of claim 17, further comprising:

a residue generating circuit to output the positive component and the negative component of the residue value at the positive input terminal and the negative input terminal respectively.

19. The circuit of claim 17, further comprising:

an analog-to-digital converter coupled to the positive output terminal and the negative output terminal.

20. The circuit of claim 17, further comprising:

a comparing circuit coupled to the positive output terminal and the negative output terminal; and a state machine coupled to an output of the comparing circuit.

* * * * *